United States Patent
Purayath et al.

(10) Patent No.: US 9,698,149 B2
(45) Date of Patent: Jul. 4, 2017

(54) NON-VOLATILE MEMORY WITH FLAT CELL STRUCTURES AND AIR GAP ISOLATION

(71) Applicant: SanDisk Technologies Inc., Plano, TX (US)

(72) Inventors: Vinod Robert Purayath, Santa Clara, CA (US); George Matamis, San Jose, CA (US); Henry Chien, San Jose, CA (US); James Kai, Santa Clara, CA (US); Yuan Zhang, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/595,553

(22) Filed: Jan. 13, 2015

(65) Prior Publication Data

US 2015/0123191 A1    May 7, 2015

Related U.S. Application Data

(62) Division of application No. 13/162,550, filed on Jun. 16, 2011, now Pat. No. 8,946,048.
(Continued)

(51) Int. Cl.
*H01L 27/115* (2017.01)
*H01L 27/11524* (2017.01)
(Continued)

(52) U.S. Cl.
CPC .. *H01L 27/11524* (2013.01); *H01L 21/28273* (2013.01); *H01L 21/28282* (2013.01);
(Continued)

(58) Field of Classification Search
CPC .................................. H01L 29/0649–29/0653
See application file for complete search history.

(56) References Cited

U.S. PATENT DOCUMENTS

| 7,511,994 B2 | 3/2009 | Aritome |
| 7,737,015 B2 | 6/2010 | Kohli et al. |

(Continued)

FOREIGN PATENT DOCUMENTS

| EP | 1418618 A2 | 5/2004 |
| EP | 1672687 A1 | 6/2006 |

(Continued)

OTHER PUBLICATIONS

Ragunathan, Shyam, et al., "Investigation of Ballistic Current in Scaled Floating-gate NAND FLASH and a Solution," IEEE International Electron Devices Meeting (IEDM), Dec. 2009, pp. 34.1.1-34.1.4.

(Continued)

*Primary Examiner* — Marc Armand
*Assistant Examiner* — Quinton Brasfield
(74) *Attorney, Agent, or Firm* — Vierra Magen Marcus LLP

(57) ABSTRACT

High-density semiconductor memory is provided with enhancements to gate-coupling and electrical isolation between discrete devices in non-volatile memory. The intermediate dielectric between control gates and charge storage regions is varied in the row direction, with different dielectric constants for the varied materials to provide adequate inter-gate coupling while protecting from fringing fields and parasitic capacitances. Electrical isolation is further provided, at least in part, by air gaps that are formed in the column (bit line) direction and/or air gaps that are formed in the row (word line) direction.

20 Claims, 20 Drawing Sheets

Related U.S. Application Data

(60) Provisional application No. 61/356,600, filed on Jun. 19, 2010.

(51) Int. Cl.

| | | |
|---|---|---|
| *H01L 21/28* | (2006.01) | |
| *H01L 21/764* | (2006.01) | |
| *H01L 21/768* | (2006.01) | |
| *H01L 27/11521* | (2017.01) | |
| *H01L 27/11568* | (2017.01) | |
| *H01L 29/06* | (2006.01) | |

(52) U.S. Cl.
CPC ........ *H01L 21/764* (2013.01); *H01L 21/7682* (2013.01); *H01L 27/11521* (2013.01); *H01L 27/11568* (2013.01); *H01L 29/0649* (2013.01)

(56) References Cited

U.S. PATENT DOCUMENTS

| | | | |
|---|---|---|---|
| 7,795,080 | B2 | 9/2010 | Orimoto et al. |
| 7,800,155 | B2 | 9/2010 | Matsuno |
| 7,863,190 | B1 | 1/2011 | Papasouliotis |
| 7,884,415 | B2 | 2/2011 | Nagano |
| 7,905,959 | B2 | 3/2011 | Tzu et al. |
| 8,053,347 | B2 | 11/2011 | Kang et al. |
| 8,129,264 | B2 | 3/2012 | Kim et al. |
| 8,325,529 | B2 | 12/2012 | Huang et al. |
| 8,362,542 | B2 | 1/2013 | Kang et al. |
| 8,383,479 | B2 | 2/2013 | Purayath et al. |
| 8,492,224 | B2 | 7/2013 | Purayath et al. |
| 8,546,239 | B2 | 10/2013 | Harari et al. |
| 8,603,890 | B2 | 12/2013 | Purayath et al. |
| 2006/0194390 | A1 | 8/2006 | Imai et al. |
| 2007/0184615 | A1 | 8/2007 | Brazzelli et al. |
| 2007/0257305 | A1 | 11/2007 | Sasago et al. |
| 2008/0003743 | A1* | 1/2008 | Lee ................... H01L 27/11521 438/257 |
| 2008/0283898 | A1 | 11/2008 | Kuniya |
| 2009/0059669 | A1 | 3/2009 | Toriyama et al. |
| 2009/0212352 | A1 | 8/2009 | Aoyama et al. |
| 2009/0267131 | A1 | 10/2009 | Nitta |
| 2010/0019311 | A1* | 1/2010 | Sato ................... H01L 21/28273 257/326 |
| 2010/0127320 | A1 | 5/2010 | Nishihara et al. |
| 2010/0172183 | A1* | 7/2010 | Lue .................... G11C 16/0466 257/324 |
| 2010/0230741 | A1 | 9/2010 | Choi et al. |
| 2011/0057250 | A1 | 3/2011 | Higashi |
| 2011/0122698 | A1* | 5/2011 | Izumida ............. G11C 16/0408 257/324 |
| 2011/0303967 | A1* | 12/2011 | Harari .................. H01L 21/764 257/321 |
| 2011/0309430 | A1 | 12/2011 | Purayath et al. |
| 2012/0049245 | A1 | 3/2012 | Bicksler et al. |
| 2012/0126303 | A1 | 5/2012 | Arai et al. |
| 2012/0126306 | A1 | 5/2012 | Kawaguchi et al. |
| 2012/0276713 | A1 | 11/2012 | Miyahara et al. |

FOREIGN PATENT DOCUMENTS

| | | |
|---|---|---|
| EP | 1835530 A2 | 9/2007 |
| JP | 2012109464 A * | 6/2012 |

OTHER PUBLICATIONS

Ragunathan, Shyam, et al., "Investigation of Ballistic Current in Scaled Floating-gate NAND FLASH and a Solution," Powerpoint Presentation, IEEE International Electron Devices Meeting (IEDM), Dec. 2009, pp. 1-38.

International Search Report & The Written Opinion of the International Searching Authority dated Sep. 16, 2011, International Application No. PCT/US2011/040874.

International Preliminary Report on Patentability dated Dec. 19, 2012, International Application No. PCT/US2011/040874.

Restriction Requirement dated Jan. 3, 2013, U.S. Appl. No. 13/162,550, filed Jun. 16, 2011.

Response to Restriction Requirement dated Feb. 4, 2013, U.S. Appl. No. 13/162,550, filed Jun. 16, 2011.

Restriction Requirement dated Aug. 13, 2013, U.S. Appl. No. 13/162,550, filed Jun. 16, 2011.

Response to Restriction Requirement dated Sep. 10, 2013, U.S. Appl. No. 13/162,550, filed Jun. 16, 2011.

Non-final Office Action dated Jan. 17, 2014, U.S. Appl. No. 13/162,550, filed Jun. 16, 2011.

Response to Office Action dated May 7, 2014, U.S. Appl. No. 13/162,550, filed Jun. 16, 2011.

Notice of Allowance dated Oct. 3, 2014, U.S. Appl. No. 13/162,550, filed Jun. 16, 2011.

* cited by examiner

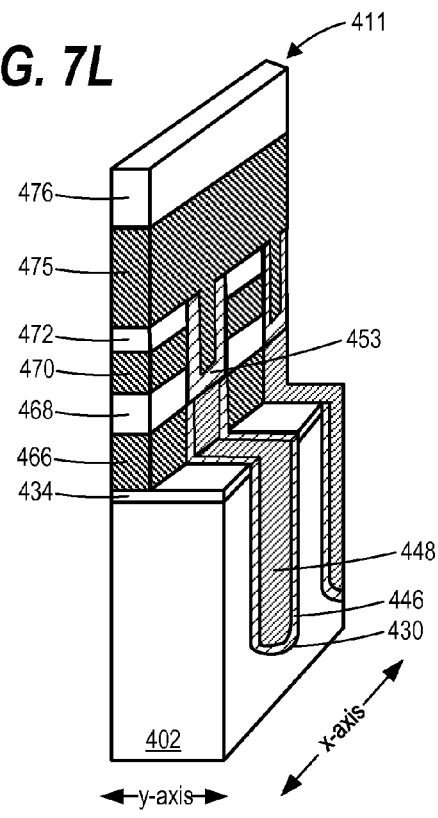
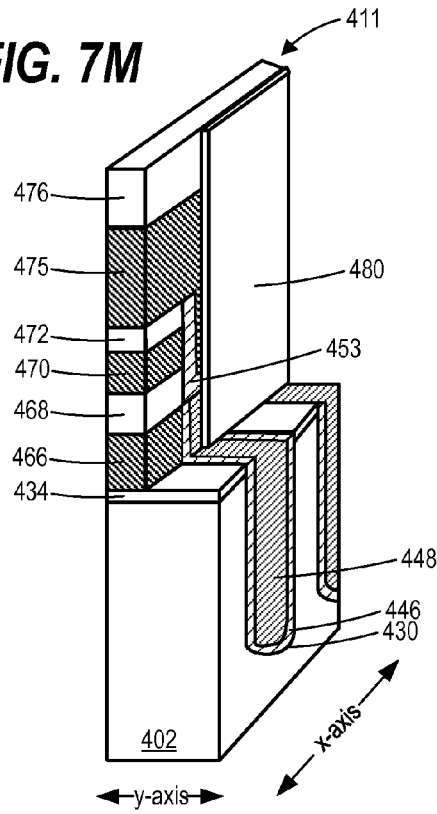
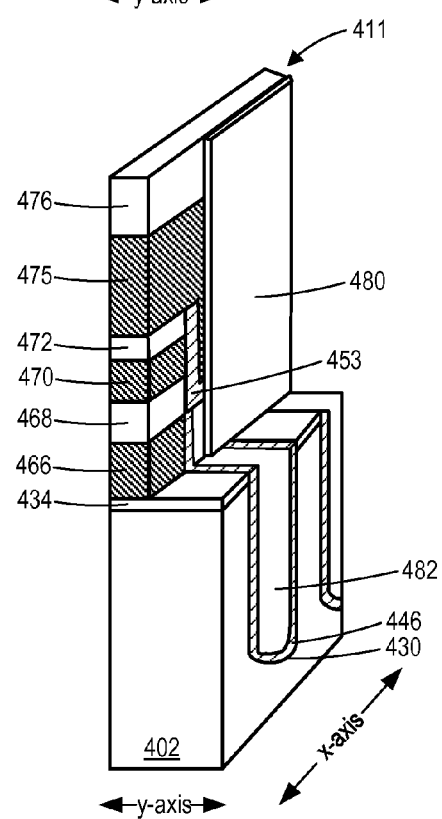

NON-VOLATILE MEMORY WITH FLAT CELL STRUCTURES AND AIR GAP ISOLATION

PRIORITY CLAIM

The present application is a divisional application of U.S. patent application Ser. No. 13/162,550, entitled "Method Of Fabricating Non-Volatile Memory With Flat Cell Structures And Air Gap Isolation," by Purayath, et al., filed Jun. 16, 2011, now U.S. Pat. No. 8,946,048, which claims priority from U.S. Provisional Patent Application No. 61/356,600, entitled "Flat Non-Volatile Memory Cells with Air Gap Isolation," by Purayath, et al., filed Jun. 19, 2010, both of which are incorporated by reference herein in their entirety.

BACKGROUND OF THE INVENTION

Field of the Disclosure

Embodiments of the present disclosure are directed to high density semiconductor devices, such as non-volatile storage, and methods of forming the same.

Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes.

DETAILED DESCRIPTION

Figure 1:
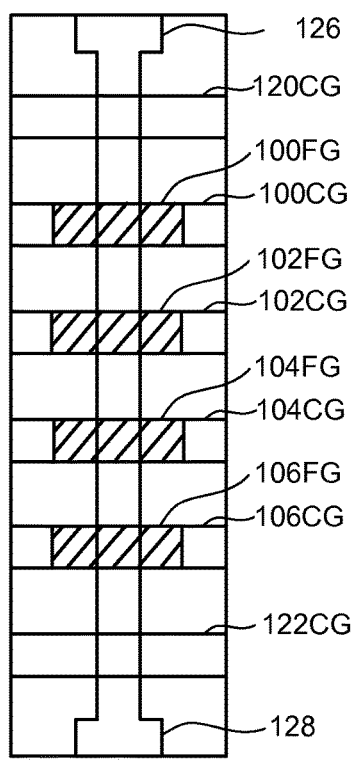
FIG. 1 is a top view of a NAND string.
Figure 2:
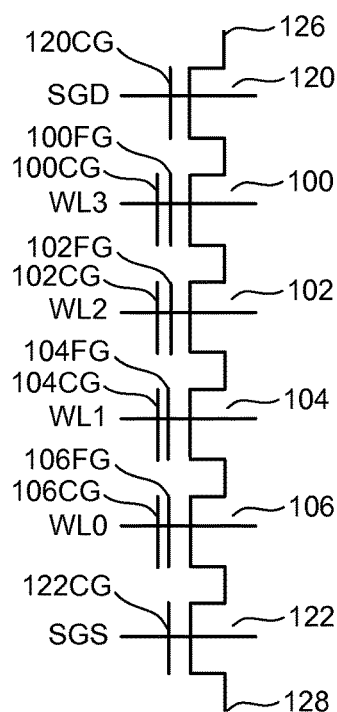
FIG. 2 is an equivalent circuit diagram of the NAND string depicted in FIG. 1.

Embodiments of the present disclosure are directed to high-density semiconductor memory, and more particularly to electrical isolation between discrete devices in non-volatile memory. The intermediate dielectric between control gates and charge storage regions is varied in the row direction, with different dielectric constants for the varied materials to provide adequate inter-gate coupling while protecting from fringing fields and parasitic capacitances. Electrical isolation is further provided, at least in part, by air gaps that are formed in the column (bit line) direction and/or air gaps that are formed in the row (word line) direction. Non-volatile memory arrays and related methods of fabrication are provided.

In one embodiment, a flat memory cell structure is provided, having an intermediate dielectric region between an individual charge storage region and its overlying control gate. The intermediate dielectric region is etched in both the column and row directions, forming a discrete region for each storage element. A first control gate layer (optional) is formed with an intermediate dielectric layer, charge storage layer, and tunnel dielectric layer, which are etched to form layer stack columns (in the column direction). Isolation regions are etched in the substrate between active areas underlying the columns. Cap strips are formed between the layer stack columns, extending in the row and column directions over the corresponding isolation region. Sacrificial materials may be formed in the isolation region or a bridge strip formed along a portion of the charge storage material prior to forming the cap strips. The intermediate dielectric region overlying the charge storage regions has a high dielectric constant. The cap strips, which are formed adjacent to the intermediate dielectric regions and overlie the isolation regions, have a lower dielectric constant to provide less coupling at these regions. The cap strips can be recessed in one embodiment. A second control gate layer is then formed, which can extend into the recesses. The layer stack is then etched to form second control gate strips that are continuous in the row direction and that contact a row of control gate regions formed from the first control gate layer if provided. Etching also forms the intermediate dielectric regions and individual charge storage regions.

In one embodiment, air gaps are formed in the column direction, referred to as bit line air gaps, to provide electrical isolation between devices adjacent in the row direction. For example, adjacent columns of non-volatile storage elements, such as adjacent strings in a NAND type non-volatile memory, can be isolated using air gaps that are formed in the substrate between active areas underlying the adjacent columns. Although principally described with respect to NAND type non-volatile memory, it will be understood that the various air gaps described herein can be utilized in other arrays utilizing column and/or row arrangements for storage elements. The dimensions of the bit line air gaps may vary according to the specifications for individual implementations. The bit line air gaps are formed at least partially in the isolation regions and extend above the substrate surface to caps or bridges overlying the isolation regions.

The air gaps formed in the row direction, referred to as word line air gaps, can provide electrical isolation between devices adjacent in the column direction. For example, adjacent rows of non-volatile storage elements such as the non-volatile storage elements associated with adjacent word lines in a NAND type non-volatile memory can be isolated using air gaps that are formed above the substrate between adjacent rows of storage elements. The dimensions of the word line air gaps may vary according to the specifications for individual implementations. In one embodiment, the bit line air gaps are formed entirely above the substrate surface. These air gaps may extend above the surface of the substrate to at least partially occupy the area between adjacent rows of storage elements.

Figure 3:
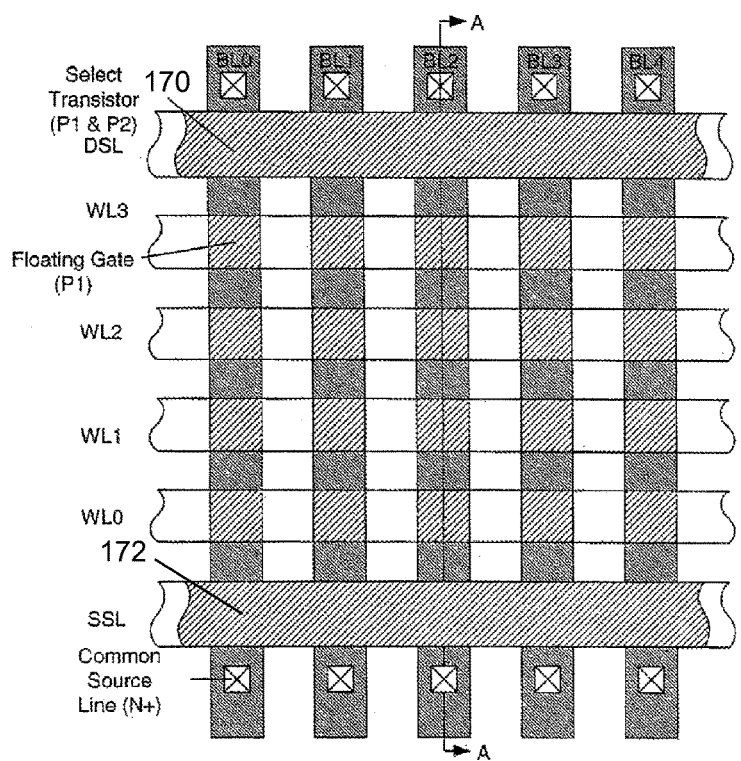
FIG. 3 is a plan view of a portion of a NAND flash memory array.
Figure 4:
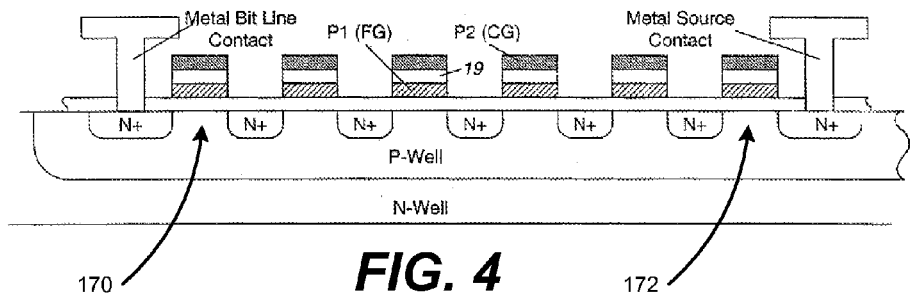
FIG. 4 is an orthogonal cross-sectional view taken along line A-A of the portion of the flash memory array depicted in FIG. 3.

A portion of a NAND memory array as can be fabricated in accordance with an embodiment of the present disclosure is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
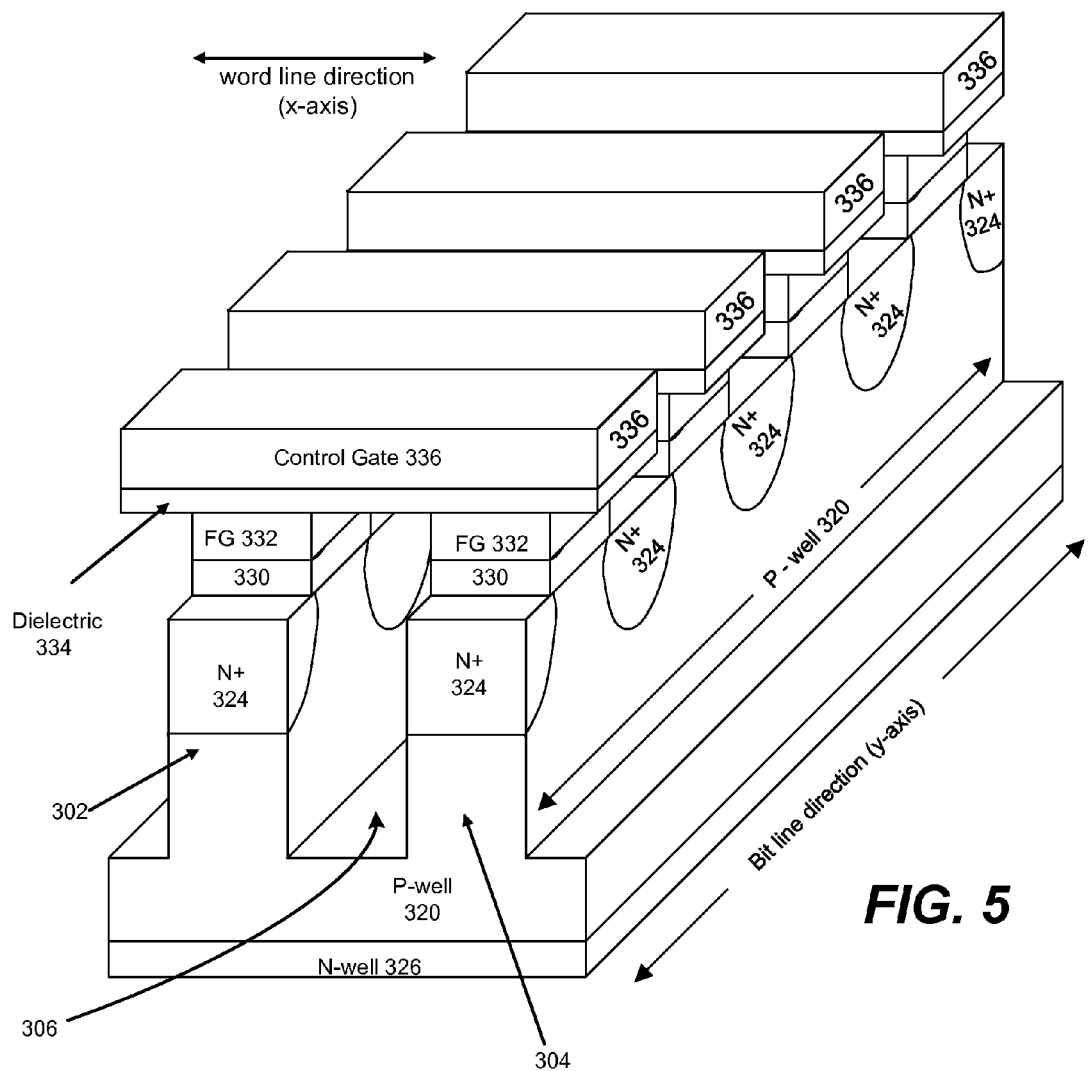
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 326 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by isolation area 306. Typically, an insulating material or dielectric is formed between adjacent NAND strings in this isolation area.

Although not shown, many non-volatile memory systems utilize control gates or word lines that wrap around the floating gate in the row direction. That is, in the word line direction, the control gate overlies a row of floating gate regions, and further extends downward between adjacent ones of the floating gate regions. The control gate layer may extend below an upper surface level of the floating gate regions in between floating gates adjacent in the row direction. The intermediate dielectric layer will likewise wrap around the floating gates and not completely fill the space between adjacent floating gates so that the control gate material may occupy a portion of that space. Such a structure provides improved coupling between the control gates and floating gates by increasing the surface area for coupling. There will exist coupling between the upper surface of the floating and lower surface of the overlying control gate and also coupling between the control gate and the sidewalls of the floating gates.

As devices continue to be scaled, reaching 2x and 1xnm feature sizes for example, there exists little space between floating gates adjacent in the row direction. Techniques for efficient utilization of this space to achieve control gate wrap around with small features sizes are provided. A flat non-volatile memory cell-type structure is further introduced to address issues with space limitations between floating gates. The floating gate and intermediate dielectric layers can be modified to get an equally robust performance as with traditional devices.

In accordance with an embodiment of the present disclosure, a flat type of memory cell structure is provided having one or more intermediate dielectric layers and/or one or more control gate layers that do not wrap around the charge storage regions. In one embodiment, the intermediate dielectric material is cut or discontinuous in the row direction. The intermediate dielectric material is a high-K material in one example. Between the cut portions of the intermediate dielectric layer above the isolation regions, a second dielectric material is formed. This material has a lower K value than the high-K intermediate dielectric material formed directly over the floating gate. This can reduce parasitic interference and leakage between the control and floating gate. The high-K intermediate dielectric layer still provides enhanced coupling. In one example, the second dielectric material is recessed, allowing the metal control gate layer to extend below the upper surface of the intermediate dielectric layer. This achieves a flat type cell device, while also providing a partial wrap-around for the control gate. Metal control gates may be provided to improve coupling between the control gates and floating gates where the control gate does not wrap around the floating gate.

In accordance with one embodiment, air gaps are introduced in the column (bit line) and/or row (word line) direction to form isolation between closely spaced components in the memory structure. Air gaps can decrease parasitic interferences between neighboring floating gates, neighboring control gates and/or between neighboring floating and control gates. Air gaps can include various material compositions and need not correspond to atmospheric air. For example, concentrations of elemental gases may vary in the air gap regions. An air gap is simply a void where no solid material is formed in the semiconductor structure.

Figure 6:
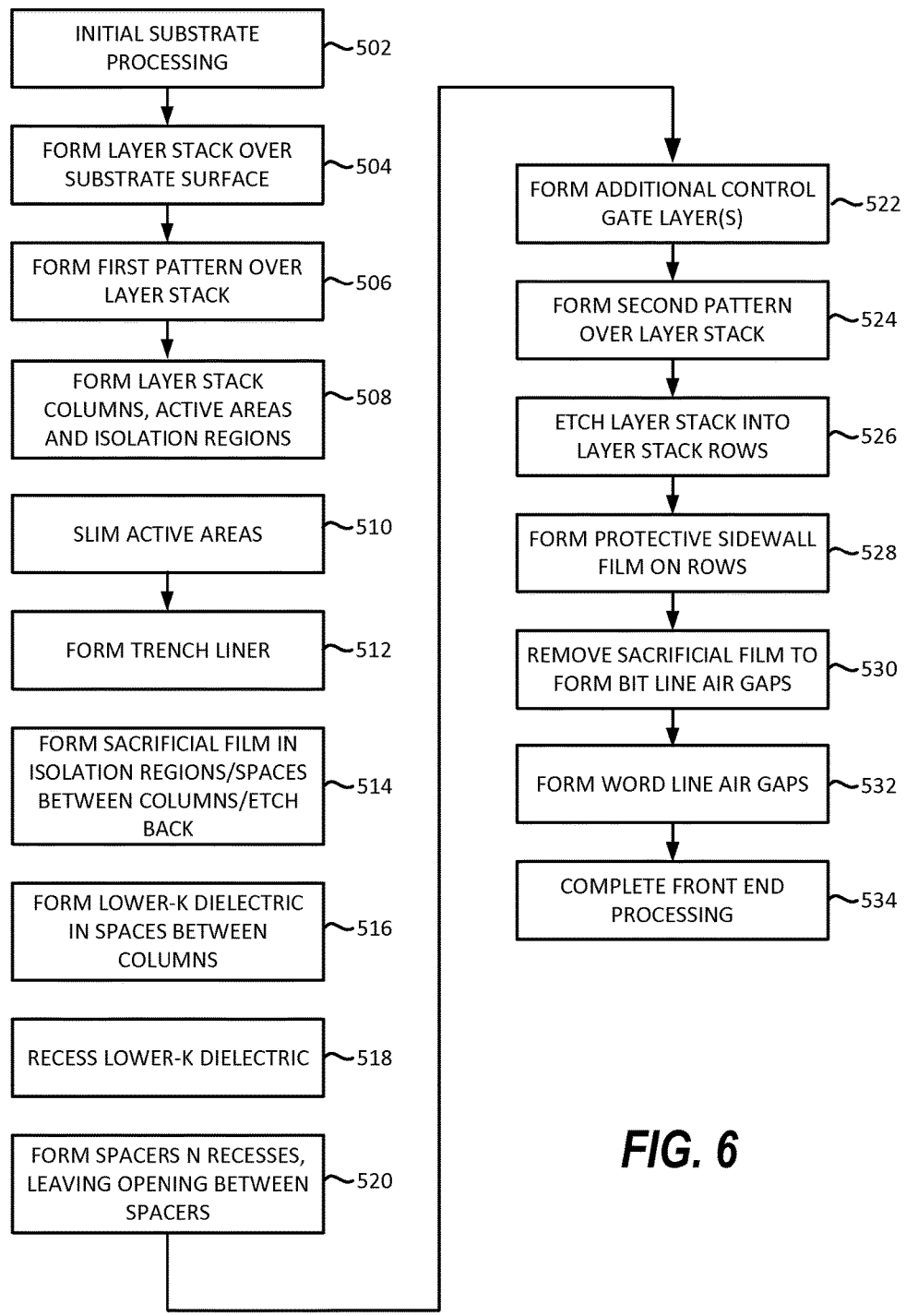
FIG. 6 is a flowchart describing a method of forming a non-volatile memory array in accordance with one embodiment.
Figure 7A:
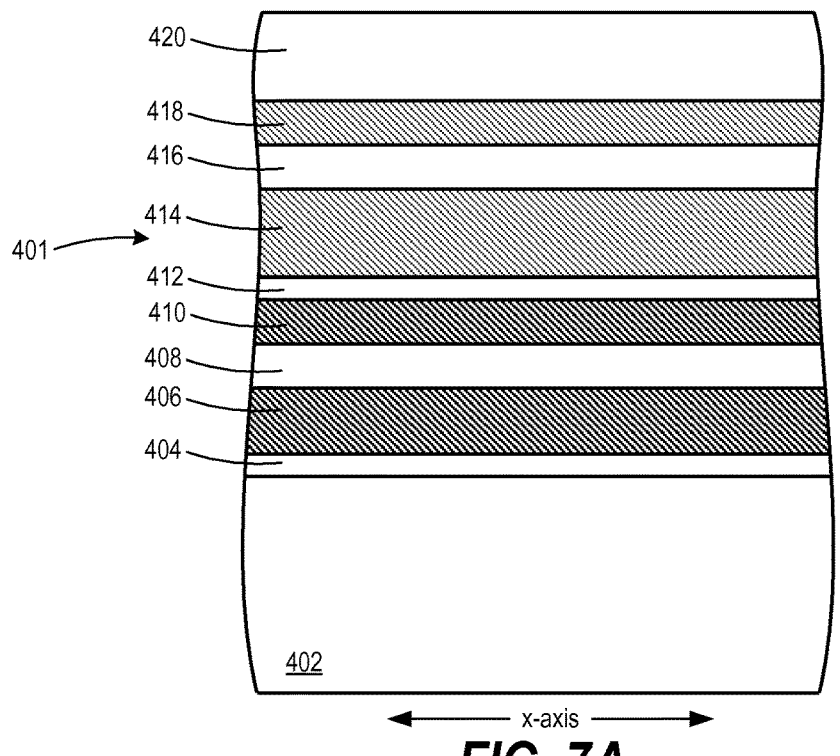
FIGS. 7A-7O are cross-sectional and perspective views of a portion of a non-volatile memory array depicting a fabrication process according to the method of FIG. 6 in one embodiment.

FIG. 6 is a flowchart describing a method of fabricating non-volatile storage with air gap isolation in accordance with one embodiment. FIGS. 7A-7O are orthogonal cross-sectional views of one example of a non-volatile memory array that can be fabricated according to the method in FIG. 6. The described embodiment is exemplary only and its precise form should not be taken as limiting the disclosure. The exact materials, dimensions and order of processing may vary according to the requirements of a given implementation. It is noted that the dimensions of the various features are not necessarily drawn to scale.

At step 502, initial processing is performed to prepare a substrate for memory fabrication. One or more wells (e.g., a triple well) are typically formed in the substrate prior to forming a layer stack over the substrate surface. For example, a p-type substrate may be used. Within the p-type substrate, an n-type well may be created and within the n-type well a p-type well may be created. Various units of a memory array may be formed within individual p-type wells. The well(s) can be implanted and annealed to dope the substrate. A zero layer formation step may also precede well formation.

At step 504, an initial layer stack is formed over the substrate surface. FIG. 7A is a cross-sectional view along the x-axis in the row or word line direction of a memory array 400 showing a layer stack 401 formed over the surface of a substrate 402. In this example, layer stack 401 includes a tunnel dielectric layer (TDL) 404, a charge storage layer (CSL) 406, an intermediate dielectric layer (IDL) 408, a first control gate layer 410, a second control gate layer 412, a sacrificial layer (SL) 414 and hard masking layer(s) (HML) 416, 418 and 420. It is noted that a layer may be said to be over another layer when one or more layers are between the two layers as well as when the two layers are in direct contact.

The tunnel dielectric layer 404 is a thin layer of oxide (e.g., Sift) grown in one embodiment, although different materials and processes can be used. Chemical vapor deposition (CVD) processes, metal organic CVD processes, physical vapor deposition (PVD) processes, atomic layer deposition (ALD) processes, thermal oxidation or other suitable techniques can be used. In one example, the tunnel oxide layer is formed to a thickness of about 8 nanometers (nm). Although not shown, one or more high voltage gate dielectric regions may be formed at a peripheral circuitry region before or after forming the tunnel dielectric layer. The high voltage gate dielectric regions may be formed with a larger thickness (e.g., 30-40 nm) than the tunnel dielectric layer.

The charge storage layer is a polysilicon floating gate layer in one embodiment. The vertical dimension (with respect to the substrate surface) or thickness of the charge storage layer can vary by embodiment. In one example, the charge storage layer has a vertical dimension of 30 nm.

Dielectric charge storage materials, metal and non-metal nanostructures (e.g., carbon) can also be used for the layer of charge storage material. In one embodiment, the charge storage layer is a metal layer forming a charge-trap type floating gate layer. A thin metal charge-trap type floating gate can reduce concerns with ballistic charge programming issues that may arise with conventional polysilicon floating gates. In one embodiment, a metal floating gate layer is formed to a thickness of between 10 nm and 20 nm. In another embodiment, metal thicknesses greater than 20 nm or less than 10 nm are used. In one embodiment, the metal floating gate layer is a high work function metal. In one example, the metal is ruthenium. Other metals such as titanium, tungsten, tantalum, nickel, cobalt, etc., and their alloys (e.g., TiN, WN, TaN, NiSi, CoSi, WSix) can be used.

The intermediate dielectric layer 408 is a high-K dielectric material in one embodiment, which can provide enhanced control gate to floating gate coupling, while reducing charge transfer through the intermediate dielectric layer. In one embodiment, layer 408 has a dielectric constant greater than 3.9. It is not required that layer 408 have a high dielectric constant, although a high-K material will provide enhanced coupling which may be beneficial when the intermediate dielectric and control gate materials do not wrap around the charge storage regions as hereinafter described. The intermediate dielectric layer may contain a triple layer of oxide, nitride and oxide (ONO) sandwiched between high-K dielectric materials in one embodiment. High-k dielectric materials include, but are not limited to, hafnium oxides, aluminum oxides, zirconium oxides, and lanthanum oxides or laminate films or combination(s) of similar films.

The first control gate layer 410 and the second control gate layer 412 may include metals, polysilicon, silicides, barrier metals and combinations of these materials. In one embodiment, the first control gate layer is formed from polysilicon and the second control gate layer is formed from a barrier metal. By way of example, the first and second control gate layers can include, respectively, (from layers to upper layers as move away from substrate surface): a barrier metal and metal; a barrier metal and polysilicon; a barrier metal and silicide (e.g., fully-silicided polysilicon (FUSI)); polysilicon and metal; or polysilicon and a barrier metal. Barrier metals may include, but are not limited to, titanium (Ti), titanium nitride (TiN), tungsten nitride (WN) and tantalum nitride (TaN) or a combination with related alloys that have a suitable electron work function. Metals may include, but are not limited to, tungsten (W), tungsten silicide (WSix) or other similar low resistivity metals. Silicides may include, but are not limited to, NiSi, CoSi. In one example, the control gate layer includes polysilicon that is subjected to silicidation after being etched into control gates so as to form a partially or fully-silicided (FUSI) control gate structures. The control gate layer may be formed by chemical vapor deposition (CVD), atomic layer deposition (ALD), plating, or other techniques.

In another embodiment, the initial layer stack does not include any control gate layers. One or more control gate layers can be provided after etching to form layer stack columns as described below.

The sacrificial layer 414 is a layer of nitride in one embodiment although other materials such as oxides can be used. In one example hard mask layer 416 is an oxide, hard mask layer 418 is polysilicon or nitride, and hard mask layer 420 is oxide. Other materials and combinations of those described may be used in other implementations.

The layer stack is patterned at step 506. The first pattern applied at step 506 corresponds to intended columns of the memory array and may be repetitive in the row or direction of the x-axis. The pattern also corresponds to intended active areas of the substrate which will be separated by isolation regions. In one embodiment, conventional photolithography using photoresist is used to pattern the hard mask layer 412 into strips elongated in the direction of the y-axis with spaces between strips adjacent in the direction of the x-axis. The hard mask layer may be patterned into a first sub-pattern at the memory array area and one or more different sub-patterns at the peripheral circuitry areas to define active areas in the substrate with different dimensions in the direction of the x-axis. Spacer-assisted patterning, nano-imprint patterning, and other patterning techniques can also be used to form strips of the hard mask layer at reduced features sizes. The pattern, repetitive in the second or row direction, may define a first direction of etching to form columns of the targeted memory array.

After forming the pattern, the layer stack and substrate are etched at step 508 using the pattern formed at step 506. The layer stack is etched into layer stack columns and the substrate is etched into active areas which underlie the columns and isolation regions which separate the active areas. The term layer stack is used to refer to the layers formed over the substrate throughout processing. Thus, layer stack 401 may refer to the collection of layer stack columns that result from etching the initial layer stack.

Figure 7B:
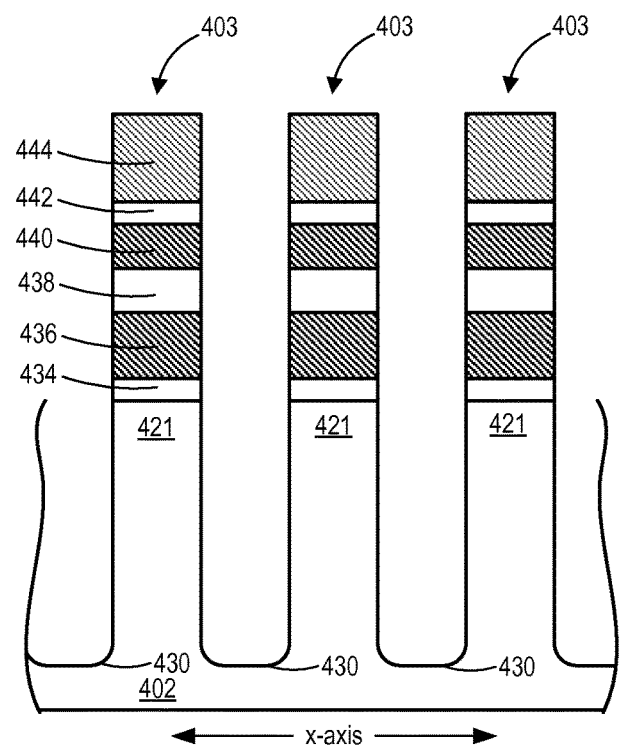

FIG. 7B depicts the memory array after etching in one example. Etching forms layer stack columns 403 that are elongated in the direction of the y-axis with spaces therebetween in the direction of the x-axis. Each layer stack column 403 includes a tunnel dielectric strip (TDS) 434, a charge storage strip (CSS) 436, an intermediate dielectric strip (IDS) 438, a first control gate strip 440, a second control gate strip 442 and a sacrificial strip (SS) 444. The hard mask strips are removed after etching. Etching continues into substrate 402 to form isolation regions 430 which are separated by active areas 421. In one example, the depth of the isolation regions in the substrate is 200 nm Various depths can be used, for example, ranging from 180-220 nm in one embodiment. In one embodiment, reactive ion etching is used with various combinational etch chemistries to etch the different layers. Any suitable etch process(es) can be used.

Figure 7C:
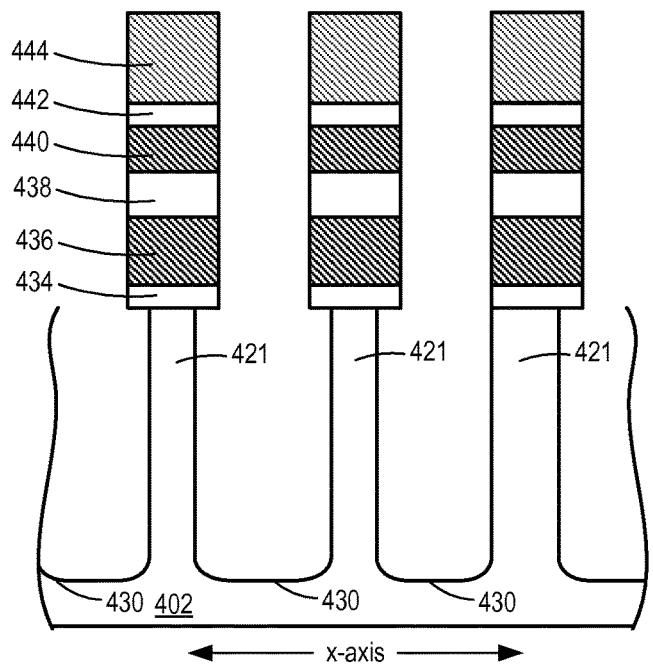

At step 510, the active areas underlying the layer stack columns are slimmed, in effect increasing the row dimension of the isolation regions. FIG. 7C depicts the results of step 510 in one example. Horizontal etching of the silicon substrate in the trenches will recess the active areas laterally. A dry or wet etch process, selective to silicon may be used. In another embodiment, oxidation may be used to consume a portion of the substrate to widen the isolation regions.

Figure 7D:
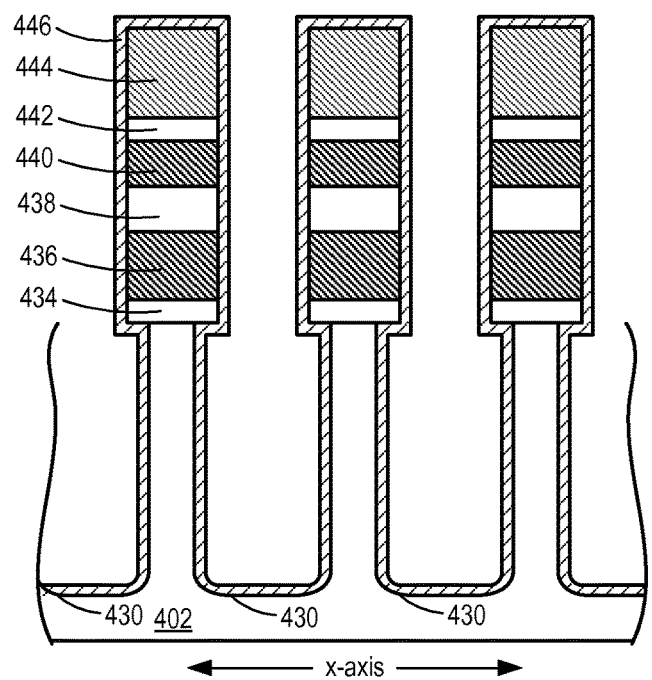

At step 512, a dielectric liner is formed along the exposed surfaces of the isolation regions in the substrate and along the exposed surfaces of the layer stack columns. FIG. 7D depicts the results of step 512 in one embodiment. A thin dielectric liner 446 coats the vertical sidewalls of the layer stack columns as well as the vertical sidewalls and lower surface of the isolation regions. In one embodiment, the liner is a high-temperature oxide (HTO) formed using a deposition process. Different thicknesses of the liner may be used. In one example, the liner has a thickness of 4 nm or less. In other examples, larger thicknesses may be used.

At step 514, the isolation regions and spaces between adjacent layer stack columns are filled with a sacrificial dielectric material. In one example, the dielectric liner is formed from a first dielectric material and a second, different dielectric material is used for the sacrificial material to fill the isolation regions. The second material may be formed with an etch selectivity that permits etching the second dielectric material without etching the first dielectric material. The sacrificial material is also etched back at step 514 so that its upper surface is below that of the upper surface of the layer stack columns. The amount of etch back may vary by embodiment. Timed etch processes may be used.

Figure 7E:
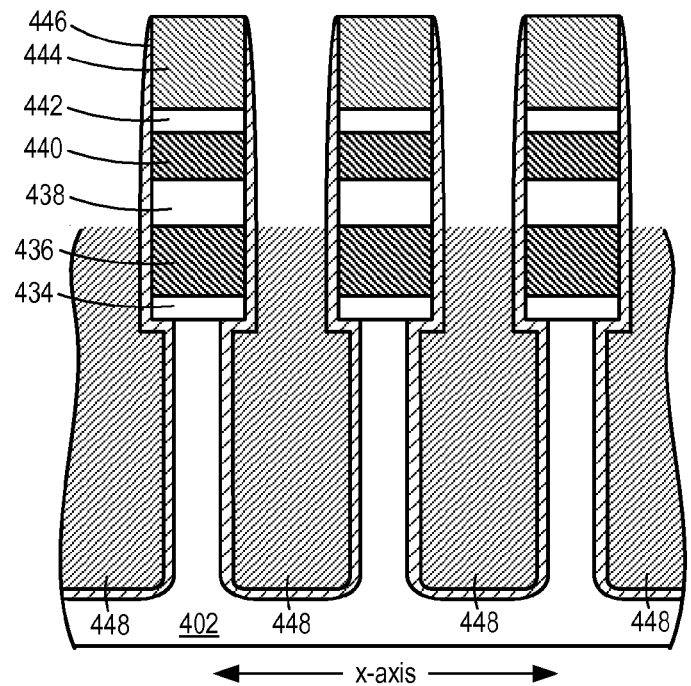

FIG. 7E depicts the memory array after forming and etching back a sacrificial dielectric material in one embodiment. The sacrificial film is formed in the remaining portions of the isolation regions and also the spaces between layer stack columns. In one embodiment, the sacrificial material 448 is a spin on dielectric (SOD) having a high etch selectivity with respect to the liner 446. In one example, the sacrificial film is a borosilicate glass (BSG) or other type of oxide. In another example, a spin-on-carbon can be used. Other materials can also be used such as polysilicon, silicon nitride (SiN) or an undensified polysilazane (PSZ) such as a PSZ-based inorganic spin-on-glass (SOG) material. The sacrificial film can be chosen for a high etch selectivity with respect to the liner so that it etches at a faster rate than the liner. A high etch selectivity of material 448 to material 446 can be achieved by skipping anneals. By not annealing sacrificial material 448, or by not annealing sacrificial material 448 to the same degree as liner 446, a high etch selectivity between layer 448 and liner 446 may be obtained.

The etch back of material 448 causes a tapered shape to portions of liner 446 lining the sidewalls of the layer stack strips. Material 448 is etched back so that its upper surface is at the level of the lower surface of the intermediate dielectric strips 438 in this example. In another embodiment, material 448 is etched back to the level of the upper surface of the intermediate dielectric strips 438. Material 448 may be etched back more or less than to these levels. Etching material 448 to the level of the lower surface of the intermediate dielectric layer facilitates the placement of an additional coupling dielectric layer at about the same level as the intermediate dielectric layer.

At step 516, the spaces between layer stack columns that result from the etch back at step 514 are filled with a second coupling dielectric layer having a lower dielectric constant than that of the intermediate dielectric layer (first coupling dielectric layer). As will be described hereinafter, this second coupling dielectric layer will overlie the isolation regions and air gaps in the final device, providing some of the separation from the control gate to the charge storage region. With a high-k intermediate dielectric layer overlying the charge storage region, this lower-k coupling dielectric layer overlying the isolation regions and air gaps can avoid parasitic capacitances that may result at the sharp edges where these materials meet.

Figure 7F:
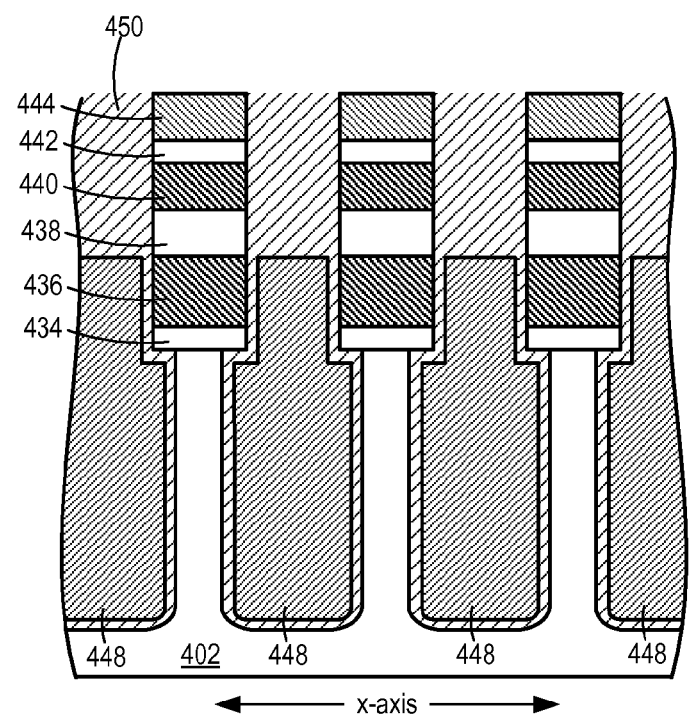

FIG. 7F depicts the results of step 516 in one embodiment. A second coupling dielectric layer is formed in the spaces shown in FIG. 7E that remain between layer stack columns. Layer 450 fills the spaces and has been etched back or planarized (e.g., CMP) to create a flat surface with interleaving strips of the sacrificial layer. In one embodiment, the second dielectric coupling layer is a layer of high temperature oxide, similar to or the same as the liner 446. Other materials having a lower dielectric constant than the intermediate dielectric strips 438 can be used.

Figure 7G:
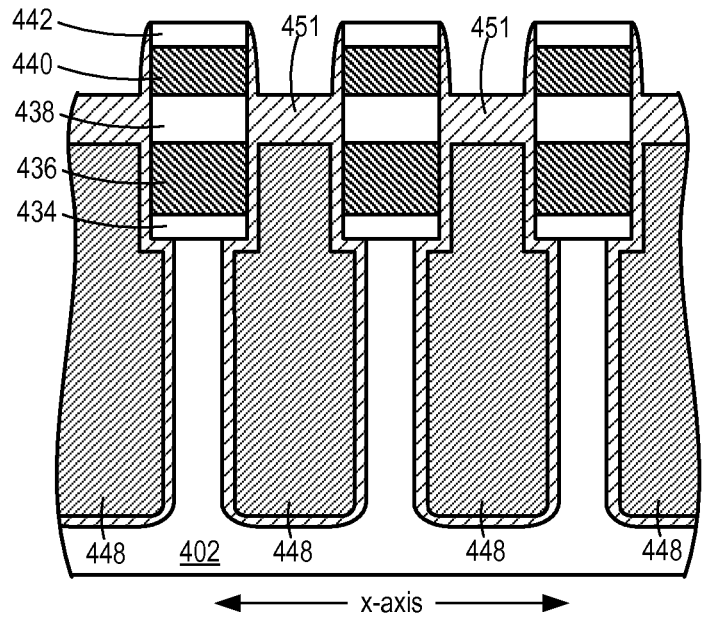

At step 518, the second dielectric coupling layer is recessed below the upper surface of the previously formed control gate strips. FIG. 7G depicts the results of step 518 in one embodiment. Material 450 is etched back to form cap strips 451 having an upper surface at or near to the level of the upper surface of the intermediate dielectric strips 438. Material 450 may be etched back by different amounts. The amount of etch back affects the distance a later formed control gate material will extend vertically toward the substrate surface. The amount of etch back may be chosen for a desired amount of coupling while avoiding unnecessary fringing fields that may degrade performance. In one embodiment, the cap strips 451 have an upper surface that is below the upper surface of control gate strips 442, but above the upper surface of the intermediate dielectric strips 438.

Figure 7H:
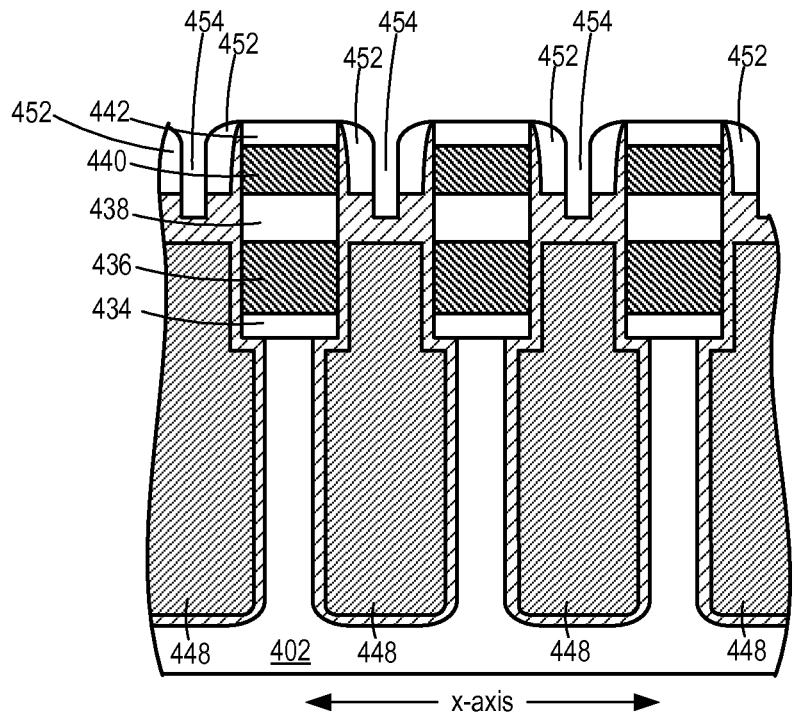

As shown in FIG. 7G, the distance between the upper surface of the strips 451 and charge storage regions 436 is small at the corners where strips 451 meet liner 456. Accordingly, one embodiment includes forming spacers at step 520. FIG. 7H depicts the results of step 520 in one embodiment. Spacers 452 are formed along the exposed surfaces of the liner material 446 coating the sidewalls of control gate strips 442 and 440. If the liner material 446 has been removed from these sidewalls, spacers 452 can be formed directly on any exposed sidewalls of the control gate strips. Spacers 452 can be formed by depositing (e.g., ALD) an oxide and etching it back in one embodiment so that spaces 454 remain between adjacent spacers, lining the opposing sidewalls of adjacent layer stack columns. In one embodiment, the material of spacers 452 has a lower dielectric constant, similar to the second coupling dielectric material formed at step 516. In another embodiment, the spacers are a high-K dielectric. As shown in FIG. 7G, an overetch is used when etching back the material to form spacers 452 to form vertical recesses or indentions in the cap strips.

Figure 7I:
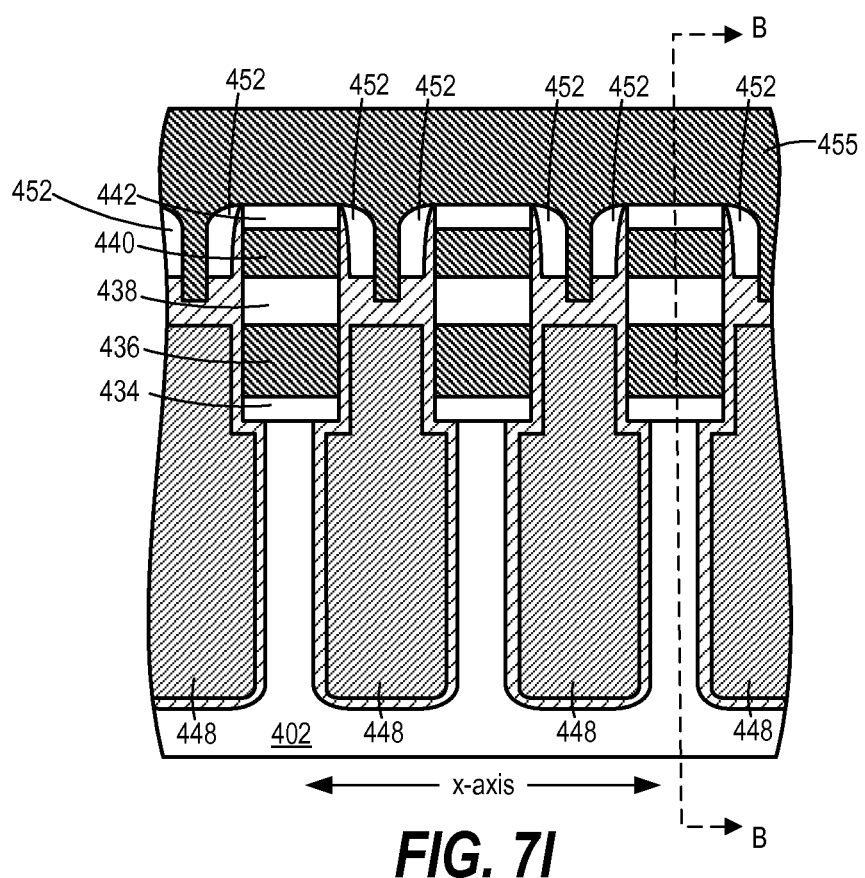

After forming the spacers, a third control gate layer 455 is formed at step 522. In one embodiment, the control gate layer formed at step 522 is the first control gate layer that is applied. FIG. 7I depicts the results of step 522 in one embodiment. The third control gate layer 455 contacts the second control gate strips 442, forming a vertically continuous control gate structure with strips 442 and 440 over each charge storage region. This third control gate layer may remain continuous in the row direction to from word lines. The third control gate layer fill spaces 454 so that the control gate extends vertically toward the substrate surface. In this example, the spaces 454 extend some distance below the upper surface of strips 451 due to the notch formed at step 520. Thus, the control gate layer extends vertically to below the upper surface of the intermediate dielectric strips 438. In other embodiments, the control gate layer may extend further toward the substrate surface or further away from the substrate surface. The amount of vertical control gate extension will influence both the amount of coupling and the potential for parasitic capacitances and fringing fields so that the distance may vary by implementation. In one embodiment, the third control gate layer is polysilicon. In another embodiment, the third control gate layer is a metal as described above.

At step 524, a second pattern is applied over the layer stack. The second pattern is formed for etching orthogonal to the direction of etching using the first pattern. The second pattern may include strips of hard mask material and/or photoresist, or other suitable mask, that are elongated in the row direction along the x-axis with a spacing between strips in the column direction along the y-axis. The pattern may define the gate length for the charge storage region of each memory cell and column dimension for each control gate structure.

Figure 7J:
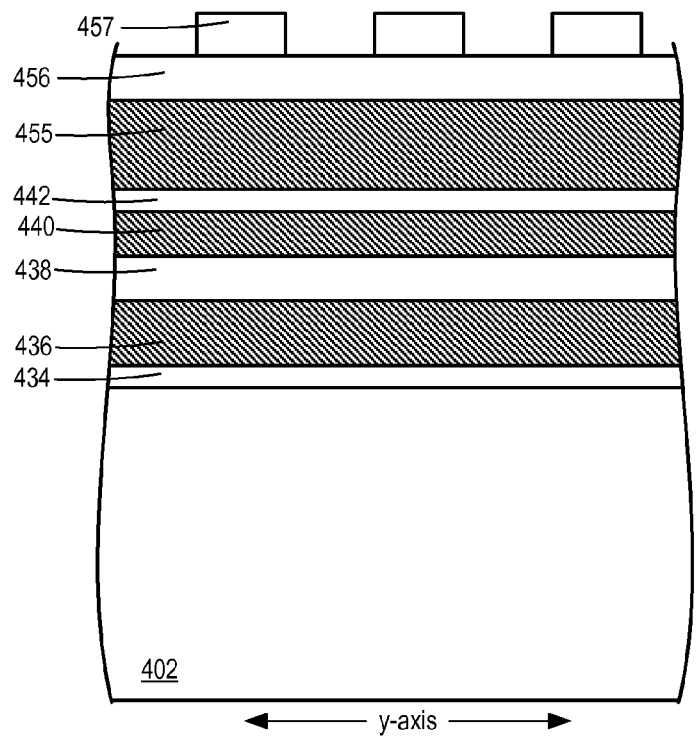

FIG. 7J is a cross-sectional view taken along line B-B of FIG. 7I, depicting the device in cross-section in the direction of the y-axis or bit line direction. FIG. 7J depicts the results of step 524 after forming the second pattern. Over the control gate layer is formed one or more hard mask layers 456. Strips 457 of photoresist or another patterning agent are applied.

At step 526, the layer stack is etched into layer stack rows. In one embodiment, etching the layer stack includes etching strips 434 of the tunnel dielectric material. In another embodiment, the tunnel dielectric is not etched. Reactive ion or another suitable etch process may be used. One or more etch chemistries may be applied to etch through the various layers of the stack.

Figure 7K:
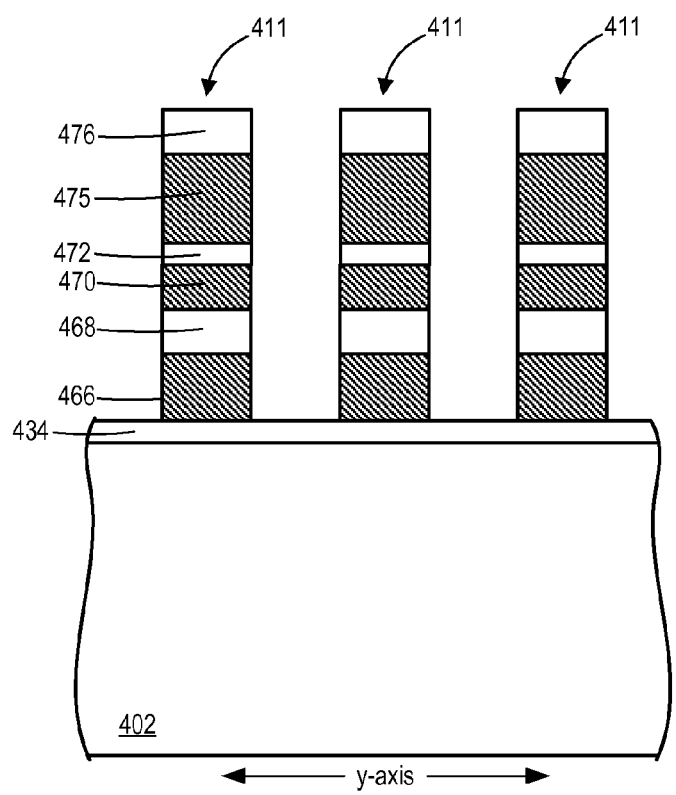
Figure 7O:
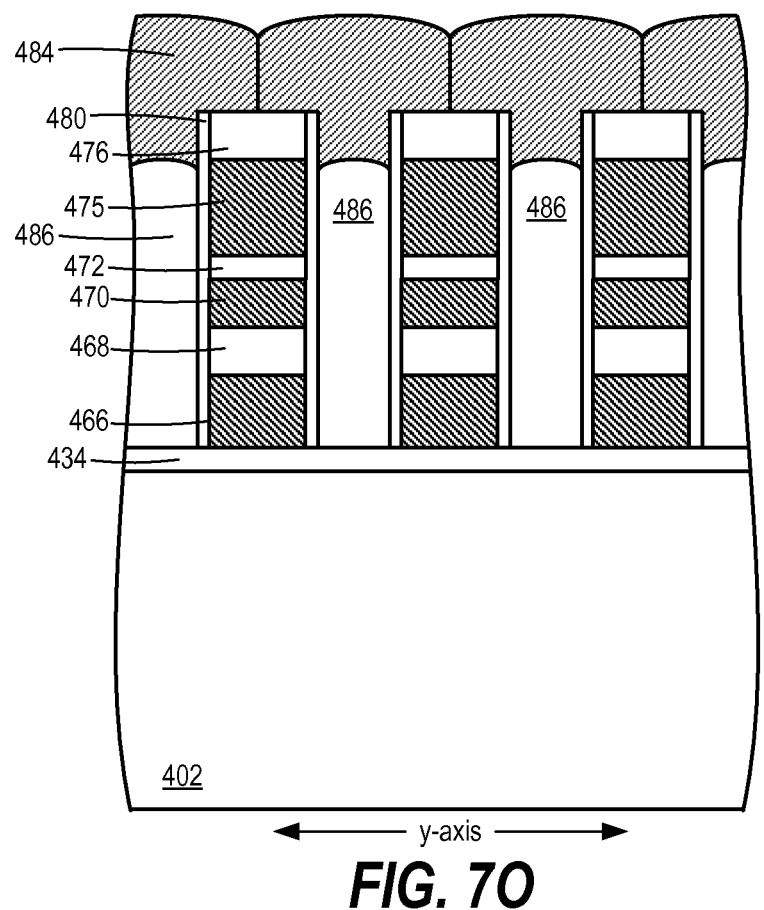

FIGS. 7K and 7L depict the results of step 526 in one embodiment. FIG. 7L is a perspective view of the device depicting the point in processing shown in the cross-sectional view of FIG. 7K. Etching continues until reaching the tunnel dielectric layer in this example. In other examples, etching may continue until reaching the substrate surface. In another example, some portion of the tunnel dielectric layer is etched without completely etching through the layer. Etching forms layer stack rows 411. The hard mask material is etched into hard mask strips (HMS) 476, the third control gate layer is etched into third control gate strips 475, the intermediate dielectric strips 442 are etched into intermediate dielectric regions 472, the second control gate strips 440 are etched into second control gate regions 470, the first control gate strips 438 are etched into first control gate regions 468 and the charge storage strips 436 are etched into charge storage regions 466. Etching through the cap strips will also form individual cap regions or caps 453. A plurality of these caps 453 will extend over each isolation region where the rows are formed. After etching the layer stack into rows an implant process can be performed to create n+ source/drain regions. In one embodiment, the n+ source/drain regions are created by implanting n-type dopants such as arsenic or phosphorus into the p-well.

At step 528, a protective sidewall film is formed along the vertical sidewalls of the layer stack rows. Different films may be used in different implementations. In one example, an oxide can be deposited and etched back to form sidewall films along the sidewalls of the individual layer stack rows. Traditional spacer formation processes may be used. FIG. 7M depicts a protective sidewall spacer 480 that is formed along the sidewall (extending in the word line direction) of one of the layer stack rows 411. The sidewall spacer 480 is depicted as only partially extending along the sidewall in the x-axis direction for clarity. The spacer will actually extend fully along the length of each layer stack row. Each layer stack row will include two sidewall spacers 480, with one on each vertical sidewall.

The sidewall spacers 480 will protect each layer stack row during subsequent processing steps. In one embodiment, the spacer material is chosen for its etch selectivity with respect to the sacrificial film 448. In this manner, the sacrificial film can later be removed in processes where the layer stack sidewalls are not exposed to the various etch chemistries. This will protect the sidewalls of the control gate layer and charge storage layer as well as the various dielectric layers.

FIG. 7M illustrates that etching back the sidewall spacer material exposes the sacrificial material 448 in trenches 430. A portion of an upper surface of the sacrificial material 448 corresponding to the spaces between adjacent layer stack rows is exposed. This allows subsequent processing to remove the sacrificial material in order to form an air gap in the bit line direction.

At step 530, the sacrificial material is removed from the isolation regions 430 and from between the layer stack columns 403. A wet etch process is used in one embodiment, although other suitable etch processes (e.g., dry) can be used. As earlier described, the etch process is selective for the sacrificial film so that it can be removed without removing the liner 446 in the isolation regions and the sidewalls spacers 480 on the layer stack rows.

FIG. 7N depicts the array after removing sacrificial material 448 from isolation regions 430 and the areas between layer stack columns. Etching removes the film from the isolation regions, beginning with the material exposed by etching back spacers 480. Etching will also remove the sacrificial material in the isolation regions that underlies the layer stack rows. Etching will begin attacking the sacrificial material from the side under the rows after etching proceeds vertically down into the isolation regions. Etching will further continue behind the sidewall spacers 480 to remove portions of the sacrificial material that extend above the isolation regions and substrate surface. Etching removes the material between charge storage regions 466 and intermediate dielectric regions 468 that are adjacent in the word line or row direction. Some of the sacrificial material may not be removed. Thus, removing the sacrificial material does not necessarily have to include removing all of the material.

Removing the sacrificial material forms bit line air gaps 482. The air gaps are elongated in the column direction in the isolation regions 430. The air gaps extend from below the surface of the substrate to the level of the upper surface of the intermediate dielectric regions. The caps 453 define an upper endpoint for portions of the air gap underlying the layer stack rows. Word line air gaps, as described hereinafter, may be formed with a capping layer that can serve as an upper endpoint of the portion of the bit line air gap not underlying a layer stack row. As earlier described, the air gaps may have different vertical dimensions in different embodiments. The air gaps may not extend as deep within isolation regions and may not extend as far above the substrate surface. Further, the air gaps may be formed exclusively within the isolation regions or exclusively between adjacent layer stack columns in other examples.

At step 532 word line air gaps are formed at least partially in the spaces between the layer stack rows. The word line air gaps extend in the x-axis or row direction between adjacent layer stack rows to provide electrical isolation or shielding between elements of adjacent layer stack rows. The vertical dimension and column dimension (along y-axis) of the air gaps can vary to meet the particular requirements of a given implementation.

FIG. 7O depicts the results of step 520 in an example where a capping layer 484 is formed over the layer stack rows using a non-conformal deposition process. By using a non-conformal deposition process, material 484 will be deposited unequally at the upper portion of the layer stack rows. Material 484 quickly accumulates, meeting at a location over the space between rows to form word line air gaps 486. Material 484 extends vertically toward the substrate surface along spacers 480. In this example, material 484 extends along spacers 480 to a level between the upper surface and lower surface of the third control gate strips 475. Because material 484 accumulates faster along spacers 480, the upper endpoint of air gap 486 extends to about the level of the upper surface of the third control gate strips 475. This distance for the air gap, extending above the control gate layers, may decrease or eliminates any fringing fields.

In one embodiment, layer 484 is an oxide but other materials such as nitrides may used in other implementations. Although not shown, some portion of dielectric 484 may enter the space between charge storage regions. This portion of the dielectric may raise the lower endpoint of the air gap in the spaces between rows, but by only a small amount. However, a very non-conformal oxide will quickly grow together to seal off the spaces as shown without a substantial decrease in the vertical dimension of the air gap. Although referred to as "air" gaps, the elemental composition of the air can include many different materials. Thus, the term "air" should not be construed as having any particular elemental composition. The air gaps are voids, where no solid material is formed. Any number and type of gases may be in the gaps 486. Although not shown, a polishing step can be applied to form individual caps from layer 484. The capping layer 484 can be polished to form plugs sealing the word line air gaps 486. A planar surface can be created for further processing steps.

At step 534, front end processing is completed. In one example, step 534 may include interconnecting the floating gate and control gate regions of select and peripheral circuitry transistors. Peripheral gate connections can be formed using vias or contact holes, etc. to form contacts to individual gate regions or to connect multiple transistors to a common control line. The select gate transistors can have their floating gate regions shorted to the control gate regions to form a single gate structure. Array connections can also be patterned and formed. After forming contacts, etc., further backend processing to form metal layers, etc. to complete the device according to known techniques can be performed. Various backend processes can be performed to finalize fabrication of the array. For example, a passivation dielectric layer can be deposited, followed by forming metal conductive lines and vias to connect the lines with source and drain regions at the end of the memory cell strings, etc.

Figure 8A:
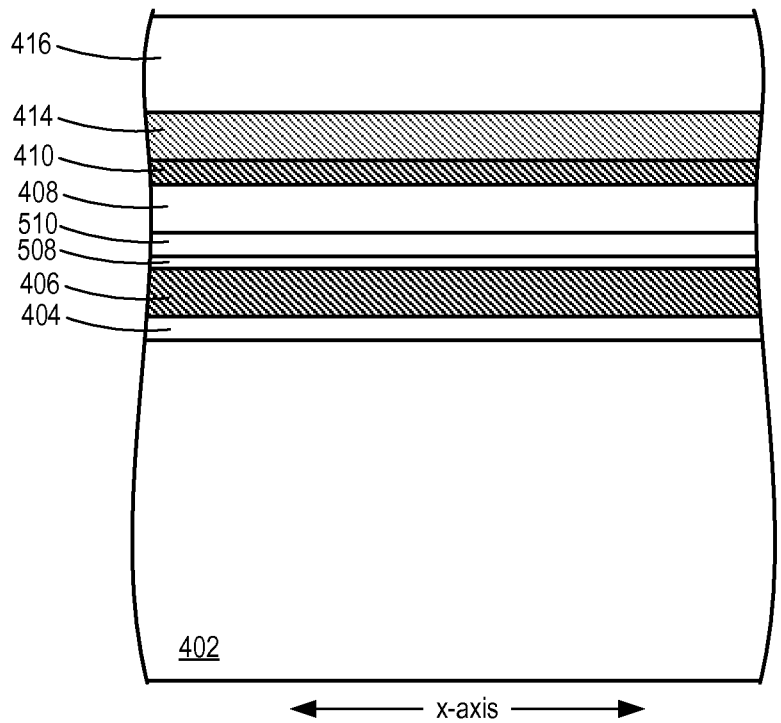
FIGS. 8A-8L are cross-views of a portion of a non-volatile memory array depicting a fabrication process in accordance with one embodiment.

FIGS. 8A-8L are orthogonal cross-sectional views depicting a variation to the fabrication process in FIGS. 6 and 7A-7O for forming a flat-cell type memory structure in one embodiment. A layer stack 401 is again formed as shown in FIG. 8A. In this embodiment, the layer stack includes the tunnel dielectric layer 404, and three charge storage layers 406, 508 and 510. In this example, layer 406 is polysilicon, layer 508 is a barrier metal and layer 510 is a metal. Various materials as described above can be used for the metal layer 510 and barrier metal layer 508, such as Ta and TaN, respectively. In another embodiment, a single metal or barrier metal layer can be used in place of the two metal layers 510 and 508. In one embodiment, an anneal can be performed to cause the silicon in layer 406 to react with the metal (e.g., Ta) in layer 508 to form a metal silicide. This creates a very good ohmic contact between polysilicon and the above lying metal. This will enable the three layers to function well as a single charge storage region. The high-dielectric constant intermediate dielectric layer 408 is formed, followed by the first control gate layer 410, sacrificial layer 414 and hard mask layer 416. In this embodiment, the first control gate layer 410 may be polysilicon and the second control gate layer 412 omitted as shown. Other combinations could be used, for example, including a polysilicon first control gate layer and a barrier metal second control gate layer as earlier described.

Figure 8B:
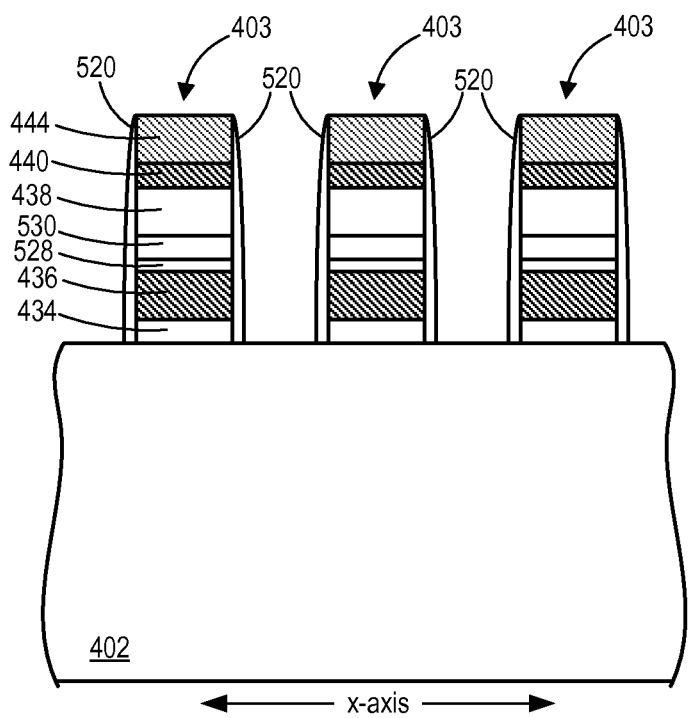
Figure 8C:
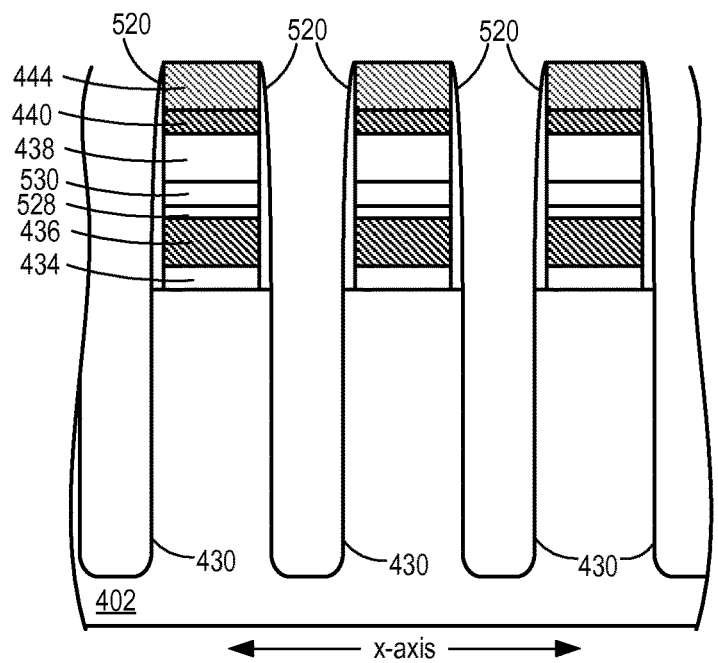
Figure 8D:
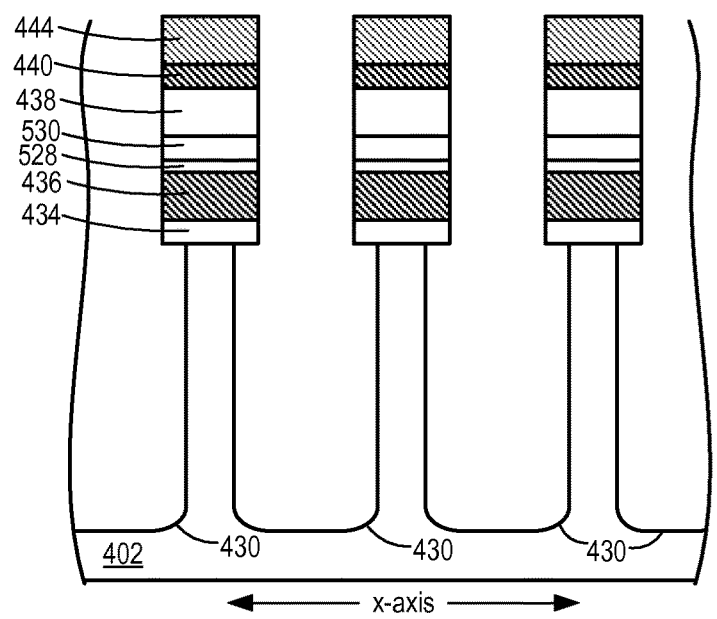

The initial layer stack is patterned and etched as shown in FIG. 8B. Etching proceeds to the substrate but does not include etching the substrate in the initial layer stack as with the embodiment in FIG. 8B. The layer stack columns 403 include tunnel dielectric strips 434, first charge storage strips 436, second charge storage strips 528, third charge storage strips 530, intermediate dielectric strips 438, first control gate strips 440 and sacrificial strips 444. Sidewall spacers 520 are formed along the vertical sidewalls of each layer stack row as shown. The sidewalls spacers are formed by depositing and etching back a TEOS layer in one embodiment but other dielectric materials may be used. After forming the sidewall spacers 520, the isolation regions 430 are etched as shown in FIG. 8C, and their row dimension in the x-axis direction is increased as shown in FIG. 8D.

Figure 8E:
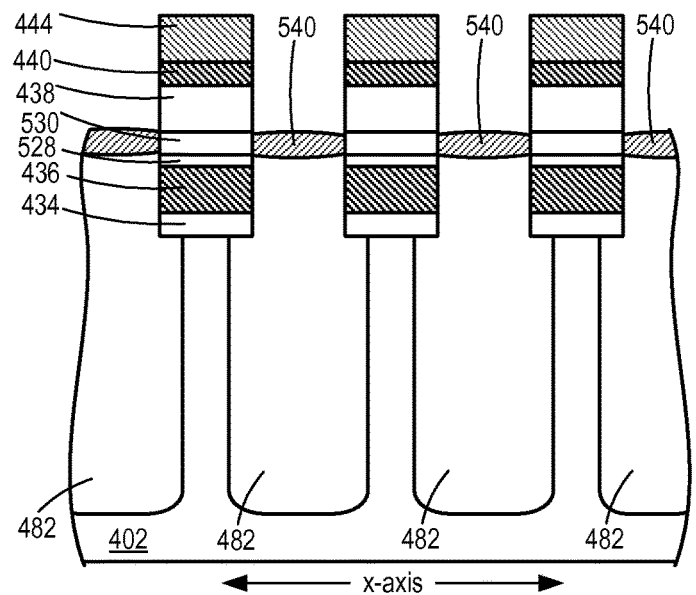

FIG. 8E depicts the formation of bridge strips 540 that are selectively grown on the third charge storage strips 530. Selective growth processes can be used to selectively grow an oxide or other dielectric capping material along the vertical sidewalls of the third charge storage strips. Although the bridge material is shown as exclusively growing on the polysilicon third charge strips to form bridge strips 540, some amount of material may grown at other locations. Thus, the term selective does not exclude the growth or formation of the material at other locations. However, selective growth does refer to a faster growth rate or accumulation at one location or region than another. In one embodiment, the bridge strips may be grown on all charge storage layers or a single charge storage layer if a single layer is provided. Additionally, the bridge strips may only be grown on a polysilicon charge storage material in one embodiment. The polysilicon may be the lowest charge storage layer as with strips 436 or may be the highest charge storage layer as with strips 530.

As shown, the bridge material, shown here as strips 540, is grown on the sidewalls of the third charge storage strips and meets to form a continuous cap in the x-axis direction. The bridge strips 540 overlie air in the isolation regions, defining bit line air gaps 482 as earlier described. In this embodiment, the bridge strips will define a portion of the upper endpoint for the bit line air gaps, rather than the capping strips formed of the second coupling dielectric. The bridge layer may also form on the sidewalls and lower surface of the isolation regions, the sidewalls of the tunnel dielectric strips 434 and sacrificial strips 444 or along portions of these surfaces. Nevertheless, the selective growth on the polysilicon material allows the bridge layer to form more quickly on the sidewalls of the charge storage strips. Thus, although the bridge layer may also grow in the isolation regions, it accumulates faster along the sidewalls of the charge storage material. Accordingly, the bridge layer meets over isolation regions 430, sealing or providing an upper cap over them (at least temporarily) so that an air gap 482 is formed in the isolation regions. In another embodiment, the bridge material can be selectively grown upon all portions of the layer stack columns above the third charge storage strips. A polishing or etch back process could be performed to create a planar layer stack surface in such an example. In either case, the bridge layer will accumulate faster along the layer stack columns so that before the regions are completely filled, the bridge layer meets to provide an upper surface for the isolation regions and air gaps. The oxide will "pinch off" or form a solid bridge or dielectric cap at the upper portion of the trench.

In one embodiment, the bridge layer is an oxide formed using a high-density plasma chemical vapor deposition process (HDP-CVD). During deposition, a TEOS and ozone ($O_3$) mixture may applied at a first ratio to form a nucleation layer on the modified surface(s). The nucleation layer may form on untreated surfaces as well, but not as quickly such that a greater quantity accumulates as on the modified surfaces. After forming the nucleation layer, the ratio of TEOS to $O_3$ may be modified to promote selective growth of the oxide on the modified surfaces of the charge storage strips. For example, the amount of ozone may be increased. Other deposition techniques that will deposit oxide faster on a polysilicon charge storage layer than on a single crystal silicon substrate can be used. In one embodiment, the third charge storage strips 530 are polysilicon and are subjected to surface modification after forming the third charge storage layer or after being etched into strips (e.g., where the first control gate layer is metal) to promote the selective growth of an HDP oxide, although this is not required. Ion implanation or other techniques may be used to introduce dopants (e.g., n-type impurities). In another embodiment, a catalyst layer may be applied over the column sidewalls or any portion thereof to selectively grow the cap strips 540.

Figure 8F:
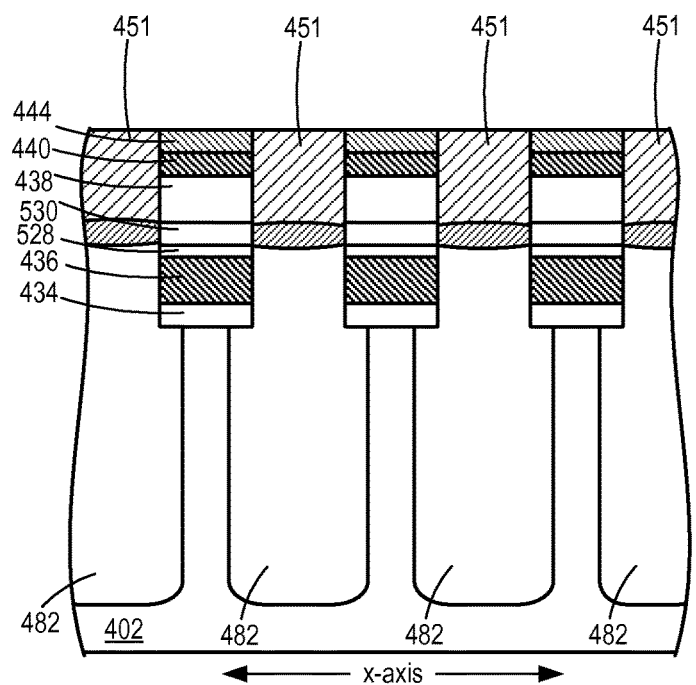
Figure 8G:
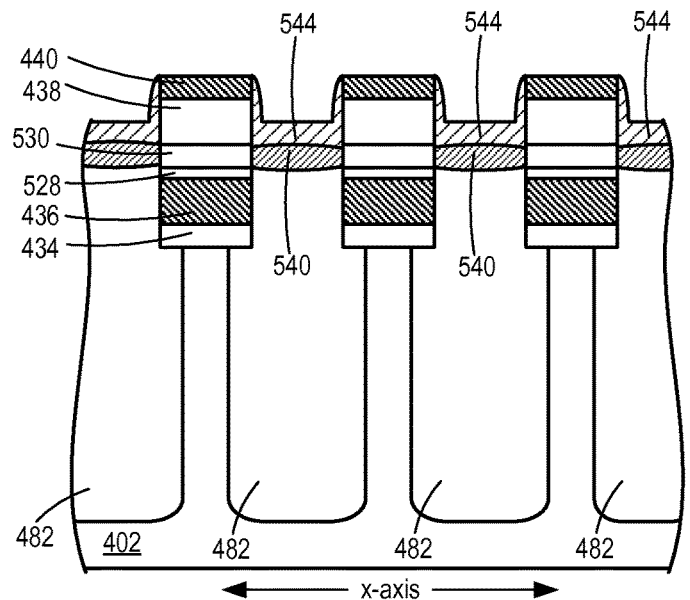

After forming bridge strips 540, the remaining spaces between layer stack columns are filled with a dielectric fill material, such as an oxide, which can be polished or etched back to form a planar upper surface of the layer stack and cap strips 451 of the fill material as shown in FIG. 8F. These cap strips, like cap strips 451 in FIGS. 7A-7O, are formed using a lower dielectric constant material, such as HTO, than the dielectric constant of the intermediate dielectric material.

Using the sacrificial strips 444 as a mask, an etch back is then performed to recess the fill material as shown in 8G. Recessing the fill material 544 creates spacers along a portion of the intermediate dielectric strips 438 and the first control gate strips 440 as shown. This etch back is similar to the etch back of material 450 to form strips 451 in FIG. 7G to permit a later formed control gate layer to extend vertically toward the substrate surface at a level lower than that of the previously formed first control gate strips 440. In this example, the etch back recesses an upper surface of each cap strip 451 to a level below the level of the upper surface of the intermediate dielectric strips 438.

Figure 8H:
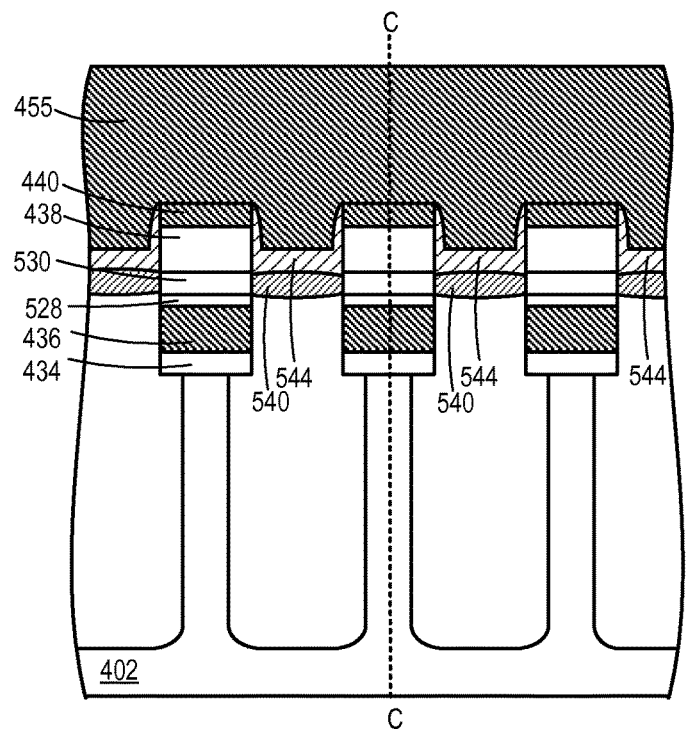

After etching back the fill strips 544, a second control gate layer 455 is formed as shown in FIG. 8H. In this example, additional spacers 452 as formed in FIG. 7H are not formed. However, these spacers may be added as earlier described. The second control gate layer 455 is a metal in one embodiment. A barrier metal layer may also be used or polysilicon.

Figure 8I:
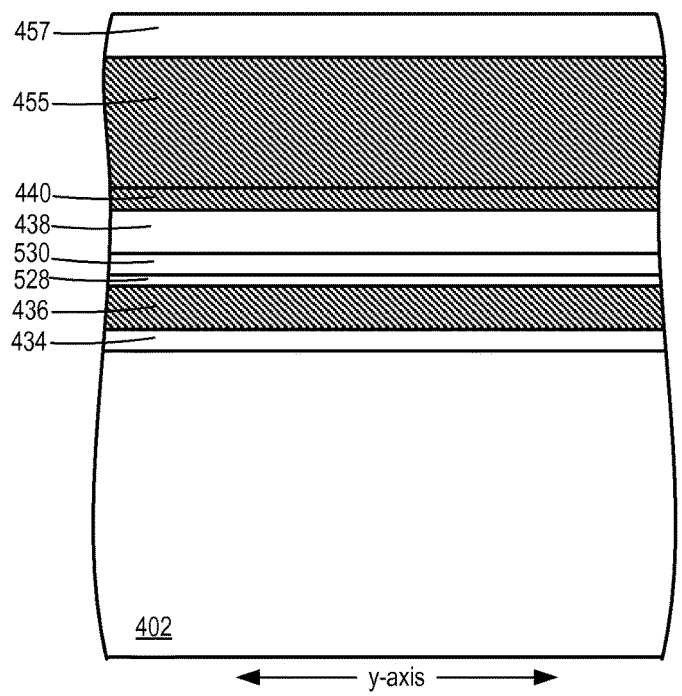
Figure 8J:
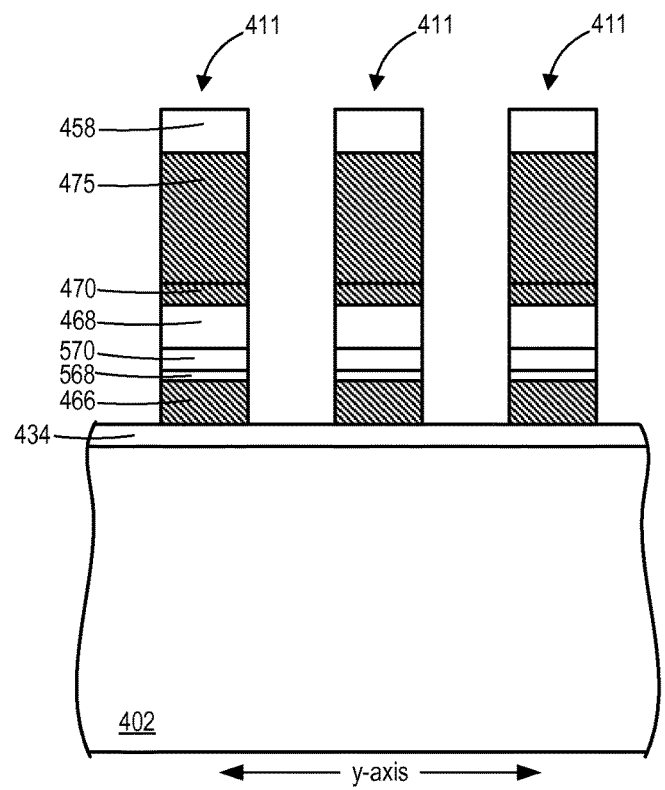
Figure 8K:
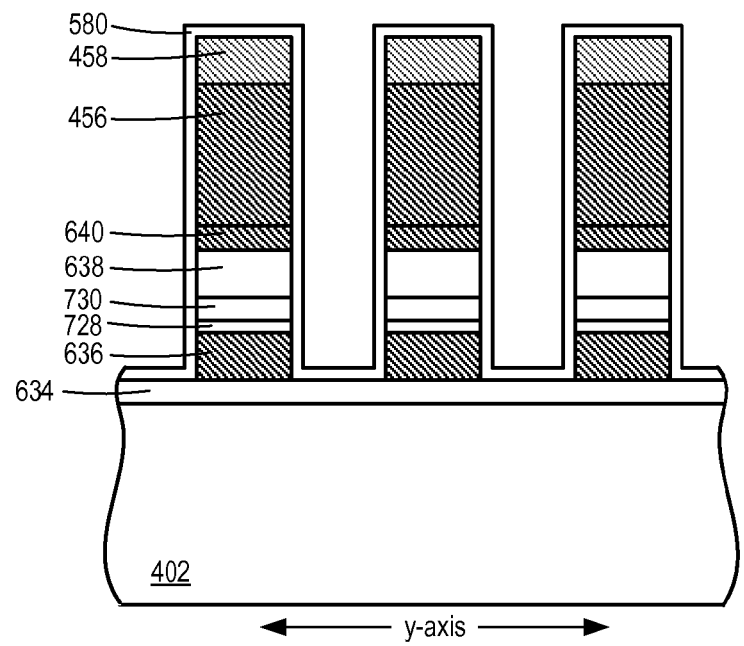
Figure 8L:
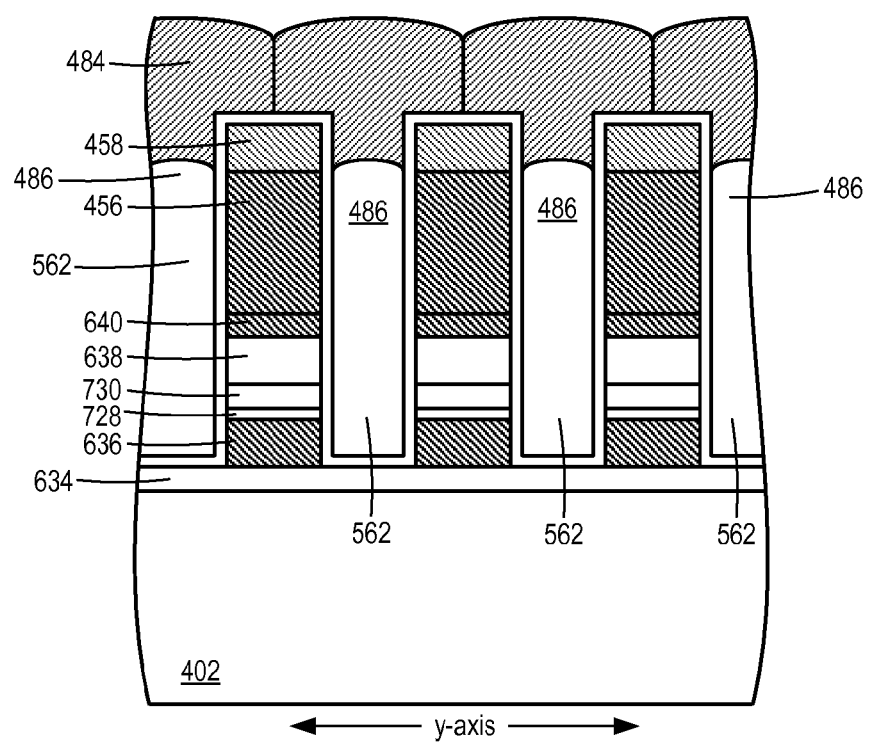

FIG. 8I is a cross-sectional view along line C-C of FIG. 8H after forming a hard mask layer 457 over (e.g., SiN) the layer stack. The layer stack is then patterned and etched into layer stack rows 411 as shown in FIG. 8J. Each row includes a hard mask strip 458, a second control gate strip 475, a first control gate region 470, an intermediate dielectric region 468, a third charge storage region 570, a second charge storage region 568 and a first charge storage region 466. A liner 580 is then formed along the vertical sidewalls of the layer stack rows as shown in FIG. 8K. The liner is an oxide, formed using an ALD process in one example. The liner overlies the upper surface of each layer stack row and the exposed upper surface of the tunnel dielectric strips between layer stack rows. FIG. 8L depicts the device after depositing a capping layer 484 to define word line air gaps 486 as earlier described.

Figure 9:
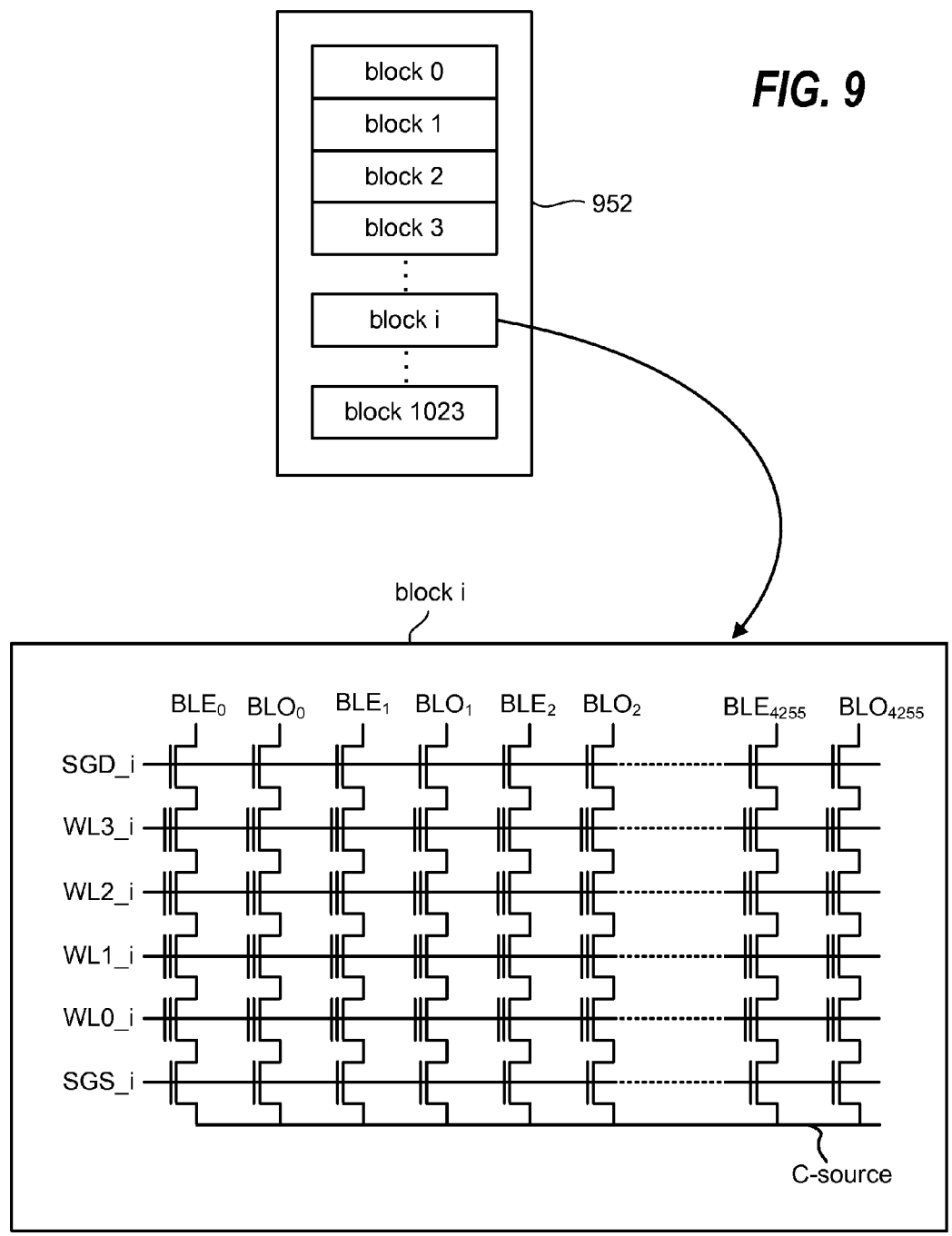
FIG. 9 depicts an example of the organization of a memory array in accordance with one embodiment.

FIG. 9 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 9 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 10:
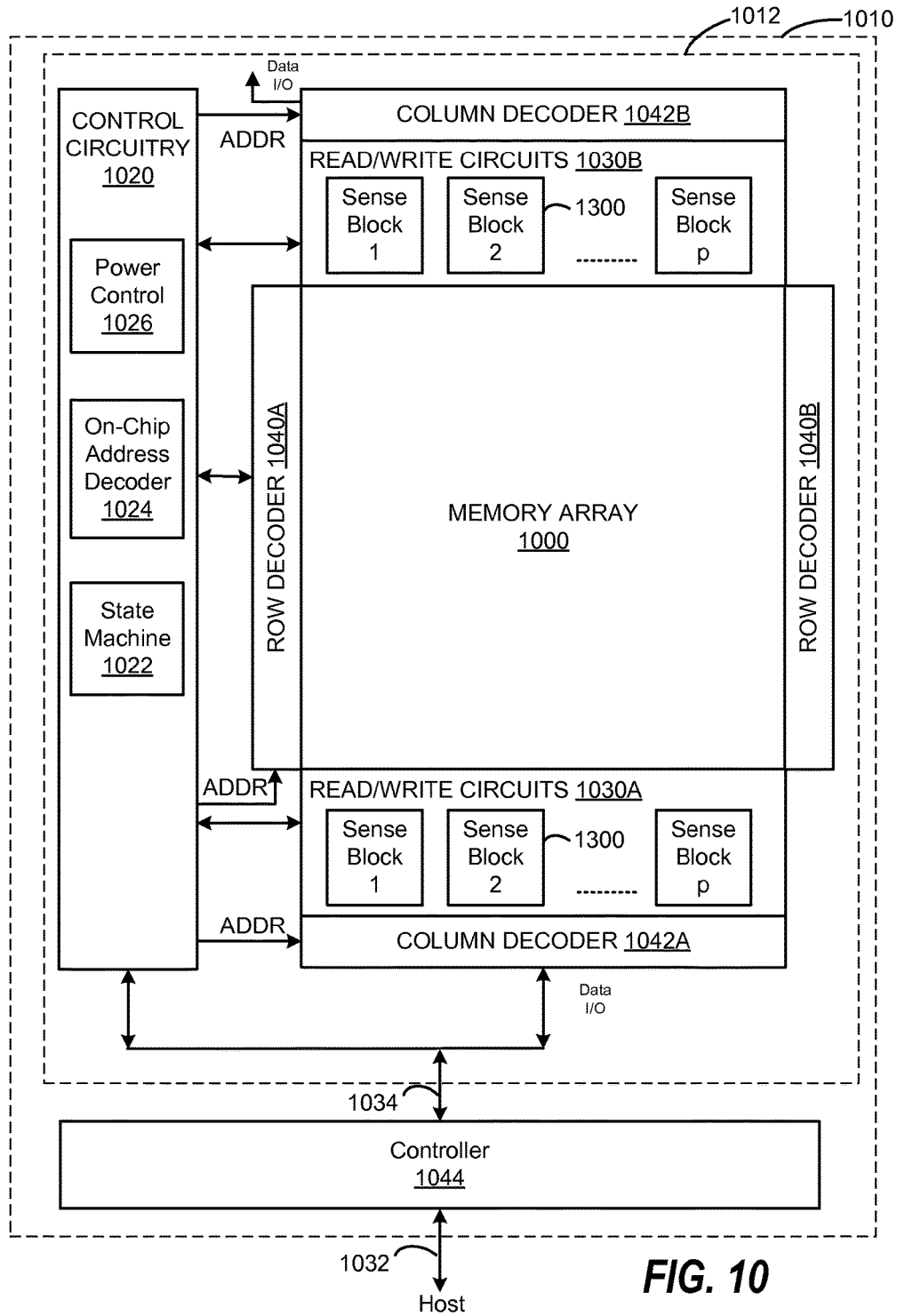
FIG. 10 is a block diagram depicting an example of a memory system that can be fabricated or used to implement embodiments of the disclosed technology.

FIG. 10 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

Figure 11:
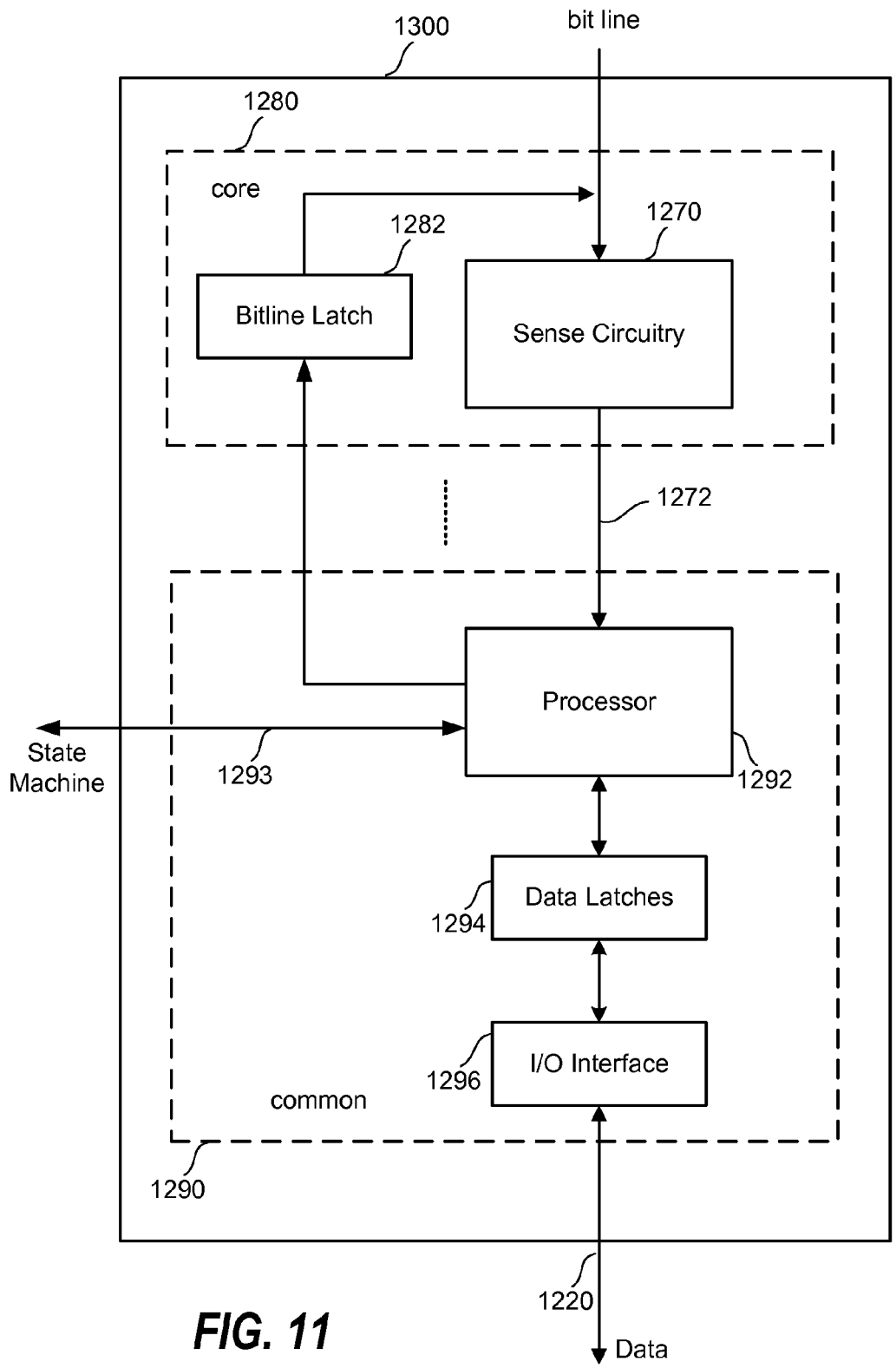
FIG. 11 is a block diagram depicting one embodiment of a sense block.

FIG. 11 is a block diagram of an individual sense block 1300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted in FIG. 12) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

In one embodiment, a non-volatile memory is provided that includes a first column of non-volatile storage elements including a first set of charge storage regions arranged in a column direction and separated from a surface of a substrate by a tunnel dielectric. The first set of charge storage regions are separated from a first set of optional control gate regions by a first set of intermediate dielectric regions overlying the first set of charge storage regions. The memory includes a second column of non-volatile storage elements adjacent to the first column of non-volatile storage elements in a row direction. The second column includes a second set of charge storage regions that are separated from the surface of the substrate by a tunnel dielectric and that are separated from an optional second set of control gate regions by a second set of intermediate dielectric regions overlying the first set of charge storage regions. The memory includes an isolation region in the substrate between an active area underlying the first column of non-volatile storage elements and an active area underlying the second column of non-volatile storage elements and a set of dielectric caps formed over the isolation region between the first column of non-volatile storage elements and the second column of non-volatile storage elements. Each cap extends in the row direction between corresponding intermediate dielectric regions of the first column and the second column that are adjacent in the row direction and have a lower dielectric constant than a dielectric constant of the intermediate dielectric regions.

In one embodiment, a method of fabricating non-volatile storage using a substrate is provided that includes forming a first layer stack column and a second layer stack column where each layer stack column includes a tunnel dielectric strip, a charge storage strip, and an intermediate dielectric strip. The first layer stack column overlies a first active area of the substrate and the second layer stack column overlies a second active of the substrate. The method further includes forming an isolation region in the substrate between the first active area and the second active area after forming the first layer stack column and the second layer stack column, forming a dielectric strip over the isolation region that extends between the intermediate dielectric strip in the first layer stack column and the intermediate dielectric strip in the second layer stack column. The dielectric cap strip has a lower dielectric constant than a dielectric constant of the intermediate dielectric strips. The method further includes forming a control gate layer after forming the dielectric strip over the isolation region.

In one embodiment, a method of fabricating non-volatile storage is provided that includes forming a first layer stack column and a second layer stack column that each includes a tunnel dielectric strip, a charge storage strip, an intermediate dielectric strip, and a first control gate strip. The first layer stack column overlies a first active area of the substrate and the second layer stack column overlies a second active of the substrate. An isolation is formed in the substrate between the first active area and the second active area and a sacrificial material is formed at least partially in the isolation region and at least partially occupying a space between the first layer stack column and the second layer stack column. The method includes forming a dielectric cap strip over the sacrificial material that extends between the intermediate dielectric strip in the first layer stack column and the intermediate dielectric strip in the second layer stack column. The dielectric cap strip has a lower constant than a dielectric constant of the intermediate dielectric strips.

In one embodiment, a method of fabricating non-volatile storage is provided that includes forming a first layer stack column and a second layer stack column that each include a tunnel dielectric strip, a charge storage strip, an intermediate dielectric strip, and a first control gate strip. The first layer stack column overlies a first active area of the substrate and the second layer stack column overlies a second active of the substrate. An isolation region is formed in the substrate between the first active area and the second active area. The method includes selectively growing a cap between the first layer stack column and the second layer stack column that extends vertically along at least a portion of the charge storage strip of the first column and the charge storage strip of the second column. The method includes forming a dielectric strip over the cap between the first layer stack column and the second layer stack column that extends vertically along at least a portion of the intermediate dielectric strip of the first layer stack column and the intermediate dielectric strip of the second layer stack column. The method includes forming a bit line air gap in the isolation region having an upper endpoint defined at least partially by the cap.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile memory, comprising:
    a first column of non-volatile storage elements including a first set of charge storage regions arranged in a column direction and separated from a surface of a substrate by a tunnel dielectric and a first set of intermediate dielectric regions overlying the first set of charge storage regions;
    a second column of non-volatile storage elements adjacent to the first column of non-volatile storage elements in a row direction, the second column including a second set of charge storage regions separated from the surface of the substrate by a tunnel dielectric and a second set of intermediate dielectric regions overlying the second set of charge storage regions;
    an isolation region in the substrate between an active area underlying the first column of non-volatile storage elements and an active area underlying the second column of non-volatile storage elements;
    a bit line air gap formed in the isolation region; and
    a set of dielectric caps formed over the bit line air gap between the first column of non-volatile storage elements and the second column of non-volatile storage elements, at least a portion of each cap extending continuously in the row direction over the bit line air gap between and at a level adjacent to corresponding intermediate dielectric regions of the first column and the second column, the set of dielectric caps having a lower dielectric constant than a dielectric constant of the intermediate dielectric regions.

2. A non-volatile memory according to claim 1, further comprising:
    a set of bridges formed below the set of dielectric caps, each bridge extending in the row direction between an adjacent charge storage region in the first set and the second set.

3. A non-volatile memory according to claim 2, wherein:
the first set of charge storage regions and the second set of charge storage regions each include a plurality of charge storage layers; and
each bridge extends vertically along less than all of the plurality of charge storage layers for corresponding charge storage regions of the first column and the second column that are adjacent in the row direction.

4. A non-volatile memory according to claim 3, wherein each bridge includes a lower surface defining a portion of an upper endpoint for the bit line air gap.

5. A non-volatile memory according to claim 1, wherein:
each dielectric cap includes an upper surface having a recess formed therein.

6. A non-volatile memory according to claim 5, further comprising:
a control gate layer divided into control gate strips that extend continuously in the row direction across the first column and the second column;
wherein each control gate strip includes a protrusion that extends into the recess of each dielectric cap.

7. A non-volatile memory according to claim 6, wherein:
the control gate layer is a second control gate layer;
the first column includes a first set of control gate regions that are formed from a first control gate layer;
the second column includes a second set of control gate regions that are formed from the first control gate layer; and
an upper surface of the set of dielectric caps is below a level of an upper surface of the control gate regions of the first set and the control gate regions of the second set.

8. A non-volatile memory according to claim 7, wherein:
each control gate strip extends vertically below a level of an upper surface of the first set of control gate regions and an upper surface of the second set of control gate regions.

9. A non-volatile memory array according to claim 1, wherein the bit line air gap has an upper endpoint defined at least in part by a lower surface of each dielectric cap.

10. A non-volatile memory array according to claim 9, wherein:
the first column of non-volatile storage elements extends in a column direction a first length over the first active area;
the second column of non-volatile storage elements extends in the column direction the first length over the first active area;
the isolation region is elongated in the substrate the first length in the column direction; and
the bit line air gap extends the first length in the column direction.

11. A non-volatile memory array according to claim 10, further comprising:
a first row of non-volatile storage elements extending in a row direction across the substrate surface, the row direction being perpendicular to the column direction, the first row including a first non-volatile storage element of the first column, a first non-volatile storage element of the second column and a first control gate strip extending in the row direction and being shared by the first non-volatile storage elements of the first and second columns;
a second row of non-volatile storage elements extending in the row direction across the substrate surface, the second row including a second non-volatile storage element of the first column, a second non-volatile storage element of the second column and a second control gate strip extending in the row direction and being shared by the second non-volatile storage elements of the first and second columns; and
a word line air gap elongated in the row direction and extending in the column direction at least a portion of a distance between the first row and the second row.

12. A non-volatile memory array according to claim 1, wherein:
the first column of non-volatile storage elements includes a first plurality of NAND strings; and
the second column of non-volatile storage elements includes a second plurality of NAND strings.

13. A non-volatile memory, comprising:
a first column of non-volatile storage elements overlying a first active area of a substrate having a surface, each non-volatile storage element of the first column including an intermediate dielectric region;
a second column of non-volatile storage elements overlying a second active area of the substrate and adjacent to the first column of non-volatile storage elements in a row direction, each non-volatile storage element of the second column including an intermediate dielectric region;
a bit line air gap formed in the substrate between the first active area and the second active area; and
a set of dielectric caps formed over the bit line air gap between the first column of non-volatile storage elements and the second column of non-volatile storage elements, each dielectric cap extending between corresponding intermediate dielectric regions of the first column and the second column that are adjacent in the row direction, the set of dielectric caps having a lower dielectric constant than a dielectric constant of the intermediate dielectric regions, at least a portion of each dielectric cap extending continuously in the row direction over the bit line air gap at a level adjacent to the corresponding intermediate dielectric regions above the substrate surface.

14. The non-volatile memory of claim 13, wherein:
each non-volatile storage element of the first column includes a control gate region separated from a charge storage region by the intermediate dielectric region;
each non-volatile storage element of the second column includes a control gate region separated from a charge storage region by the intermediate dielectric region; and
the non-volatile memory further comprises a plurality of control gate strips overlying a row of non-volatile storage elements, each row of non-volatile storage elements including corresponding non-volatile storage elements of the first column and the second column that are adjacent in the row direction.

15. The non-volatile memory of claim 14, further comprising:
a set of bridges formed below the set of dielectric caps, each bridge extending in the row direction between an adjacent charge storage region in the first set and the second set.

16. The non-volatile memory of claim 15, wherein:
the first set of charge storage regions and the second set of charge storage regions each include a plurality of charge storage layers; and
each bridge extends vertically along less than all of the plurality of charge storage layers for corresponding charge storage regions of the first column and the second column that are adjacent in the row direction.

17. A non-volatile memory, comprising:

a first column of non-volatile storage elements overlying a first active area of a substrate, each non-volatile storage element of the first column including a control gate region separated from a charge storage region by an intermediate dielectric region;

a second column of non-volatile storage elements overlying a second active area of the substrate and adjacent to the first column of non-volatile storage elements in a row direction, each non-volatile storage element of the second column including a control gate region separated from a charge storage region by an intermediate dielectric region;

a bit line air gap formed in the substrate between the first active area and the second active area;

a set of dielectric caps formed over the bit line air gap between the first column of non-volatile storage elements and the second column of non-volatile storage elements, each dielectric cap having an upper surface over the bit line air gap that is below a level of an upper surface of the control gate regions of the first column and the second column and above a level of a lower surface of the intermediate dielectric regions of the first column and the second column; and a plurality of control gate lines extending in the row direction over the first column and the second column of non-volatile storage elements, each control gate line is coupled to corresponding control gate regions of the first column and the second column that are adjacent in the row direction.

18. The non-volatile memory of claim 17, wherein:

each dielectric cap extends between corresponding intermediate dielectric regions of the first column and the second column that are adjacent in the row direction, the set of dielectric caps having a lower dielectric constant than a dielectric constant of the intermediate dielectric regions.

19. The non-volatile memory of claim 18, wherein:

each dielectric cap includes an upper surface having a recess formed therein; and each control gate line includes a protrusion that extends into the recess of each dielectric cap.

20. The non-volatile memory of claim 19, further comprising:

a set of bridges formed below the set of dielectric caps, each bridge extending in the row direction between an adjacent charge storage region in the first set and the second set;

wherein the first set of charge storage regions and the second set of charge storage regions each include a plurality of charge storage layers; and wherein each bridge extends vertically along less than all of the plurality of charge storage layers for corresponding charge storage regions of the first column and the second column that are adjacent in the row direction.

* * * * *